United States Patent
Lowrey et al.

(10) Patent No.: US 6,764,897 B2
(45) Date of Patent: Jul. 20, 2004

(54) METHOD OF MAKING PROGRAMMABLE RESISTANCE MEMORY ELEMENT

(75) Inventors: Tyler Lowrey, Troy, MI (US); Stephen J. Hudgens, Troy, MI (US); Patrick J. Klersy, Troy, MI (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 10/649,562

(22) Filed: Aug. 26, 2003

(65) Prior Publication Data

US 2004/0038445 A1 Feb. 26, 2004

Related U.S. Application Data

(63) Continuation of application No. 09/677,957, filed on Oct. 3, 2000, now Pat. No. 6,617,192, which is a continuation-in-part of application No. 09/620,318, filed on Jul. 22, 2000, which is a continuation-in-part of application No. 09/276,273, filed on Mar. 25, 1999, which is a continuation-in-part of application No. 08/942,000, filed on Oct. 1, 1997, now abandoned.

(51) Int. Cl.⁷ .......................................... H01L 21/8246
(52) U.S. Cl. ........................ 438/238; 438/95; 438/381
(58) Field of Search ................................. 438/238–240, 438/381–382, 95, 237, 275–278

(56) References Cited

U.S. PATENT DOCUMENTS

| | | | | |
|---|---|---|---|---|
| 6,236,059 B1 | * | 5/2001 | Wolstenholme et al. | 257/3 |
| 6,369,431 B1 | * | 4/2002 | Gonzalez et al. | 257/390 |
| 6,617,192 B1 | * | 9/2003 | Lowrey et al. | 438/95 |
| 2002/0020835 A1 | * | 2/2002 | Gonzalez et al. | 257/1 |

* cited by examiner

*Primary Examiner*—H. Jey Tsai
(74) *Attorney, Agent, or Firm*—Philip H. Schlazer; Marvin S. Siskind

(57) ABSTRACT

A method of making an electrically operated memory element. The memory element having a contact in electrical communication with a memory material programmable to at least a first resistance state and a second resistance state. Preferably, the contact includes at least a first region having a first resistivity and a second region having a second resistivity greater than the first resistivity where the more resistive region is adjacent to the memory material.

4 Claims, 27 Drawing Sheets

METHOD OF MAKING PROGRAMMABLE RESISTANCE MEMORY ELEMENT

RELATED APPLICATION INFORMATION

This application is a continuation of U.S. patent application Ser. No. 09/677,957 filed on Oct. 3, 2000, now U.S. Pat. No. 6,617,192 which is a continuation-in-part of U.S. patent application Ser. No. 09/620,318 filed on Jul. 22, 2000, which is a continuation-in-part of U.S. patent application Ser. No. 09/276,273 filed on Mar. 25, 1999, which is a continuation-in-part of U.S. patent application Ser. No. 08/942,000 filed Oct. 1, 1997, now abandoned. U.S. patent application Ser. No. 09/677,957 is hereby incorporated by reference herein.

FIELD OF THE INVENTION

The present invention relates generally to a uniquely designed solid state, electrically operated memory element. More specifically, the present invention relates to a new structural relationship between the electrical contacts and the memory material which are integral parts of the memory element.

BACKGROUND OF THE INVENTION

Programmable resistance memory elements formed from materials that can be programmed to exhibit at least a high or low stable ohmic state are known in the art. Such programmable resistance elements may be programmed to a high resistance state to store, for example, a logic ONE data bit. As well, they may be programmed to a low resistance state to store, for example, a logic ZERO data bit.

One type of material that can be used as the memory material for programmable resistance elements is phase change material. Phase change materials may be programmed between a first structural state where the material is generally more amorphous (less ordered) and a second structural state where the material is generally more crystalline (more ordered). The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The concept of utilizing electrically programmable phase change materials for electronic memory applications is disclosed, for example, in U.S. Pat. Nos. 3,271,591 and 3,530,441, the contents of which are incorporated herein by reference. The early phase change materials described in the '591 and '441 Patents were based on changes in local structural order. The changes in structural order were typically accompanied by atomic migration of certain species within the material. Such atomic migration between the amorphous and crystalline states made programming energies relatively high.

The electrical energy required to produce a detectable change in resistance in these materials was typically in the range of about a microjoule. This amount of energy must be delivered to each of the memory elements in the solid state matrix of rows and columns of memory cells. Such high energy requirements translate into high current carrying requirements for the address lines and for the cell isolation/address device associated with each discrete memory element.

The high energy requirements for programming the memory cells described in the '591 and '441 patents limited the use of these cells as a direct and universal replacement for present computer memory applications, such as tape, floppy disks, magnetic or optical hard disk drives, solid state disk flash, DRAM, SRAM, and socket flash memory. In particular, low programming energy is important when the EEPROMs are used for large-scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the power consumption of the mechanical systems. In the case of lap-top computers, this is of particular interest because the mechanical hard disk drive is one of the largest power consumers therein. Therefore, it would be advantageous to reduce this power load, thereby substantially increasing the operating time of the computer per charge of the power cells. However, if the EEPROM replacement for hard drives has high programming energy requirements (and high power requirements), the power savings may be inconsequential or at best unsubstantial. Therefore, any EEPROM which is to be considered a universal memory requires low programming energy.

The programming energy requirements of a programmable resistance memory element may be reduced in different ways. For example, the programming energies may be reduced by the appropriate selection of the composition of the memory material. An example of a phase change material having reduced energy requirements is described in U.S. Pat. No. 5,166,758, the disclosure of which is incorporated by reference herein. Other examples of memory materials are provided in U.S. Pat. Nos. 5,296,716, 5,414,271, 5,359,205, and 5,534,712 disclosures of which are all incorporated by reference herein.

The programming energy requirement may also be reduced through the appropriate modification of the electrical contacts used to deliver the programming energy to the memory material. For example, reduction in programming energy may be achieved by modifying the composition and/or shape and/or configuration (positioning relative to the memory material) of the electrical contacts. Examples of such "contact modification" are provided in U.S. Pat. Nos. 5341,328, 5,406,509, 5,534,711, 5,536,947, 5,687,112, 5,933,365 all of which are incorporated by reference herein. Further examples are provided in U.S. patent application Ser. No. 09/276,273, and in U.S. patent application Ser. No. 09/620,318, both of these applications are also incorporated by reference herein.

The present invention is directed to a novel structure of a programmable resistance memory element. The novel structure includes a unique electrical contact designed to provide increased Joule heating in the vicinity of the memory material and to reduce the total amount of energy needed to program the memory device.

SUMMARY OF THE INVENTION

One aspect of the present invention is a method of making an electrically programmable memory element, comprising the steps of: providing a first material; removing a portion of the first material; replacing at least a portion of the removed first material with a second material, the second material having a resistivity which is different from the resistivity of the removed first material; and introducing a programmable resistance material proximate to the second material and distant from the first material.

BRIEF DESCRIPTION OF THE DRAWINGS

FIGS. 2A'–2D' show an alternate process for making a memory device having multi-region conductive spacers as electrical contacts;

DETAILED DESCRIPTION OF THE INVENTION

The present invention is directed to electrically programmable memory elements and, in particular, to programmable resistance memory elements. The memory element preferably comprises a volume of memory material which is programmable between at least a first resistance state and a second resistance state in response to an electrical signal. The memory element further comprises a means of delivering the electrical signal to the volume of memory material. Preferably, the means of delivering the electrical signal comprises one or more electrical contacts which are in electrical communication with the volume of memory material.

In a first embodiment of the present invention, at least one of the electrical contacts is a conductive sidewall spacer. The conductive sidewall spacer is in electrical communication with the volume of memory material. As will be explained in more detail below, it is preferable that substantially all of said electrical communication is through at least a portion of an edge of the conductive sidewall spacer. That is, substantially all of the electrical communication is through an edge or a portion of an edge of the conductive sidewall spacer. It is noted that, as used herein, the terminologies "at least a portion of an edge", "an edge or a portion of an edge", "all or a portion of an edge", and "edge portion" all mean the same and may be used interchangeably.

Figure 1A:
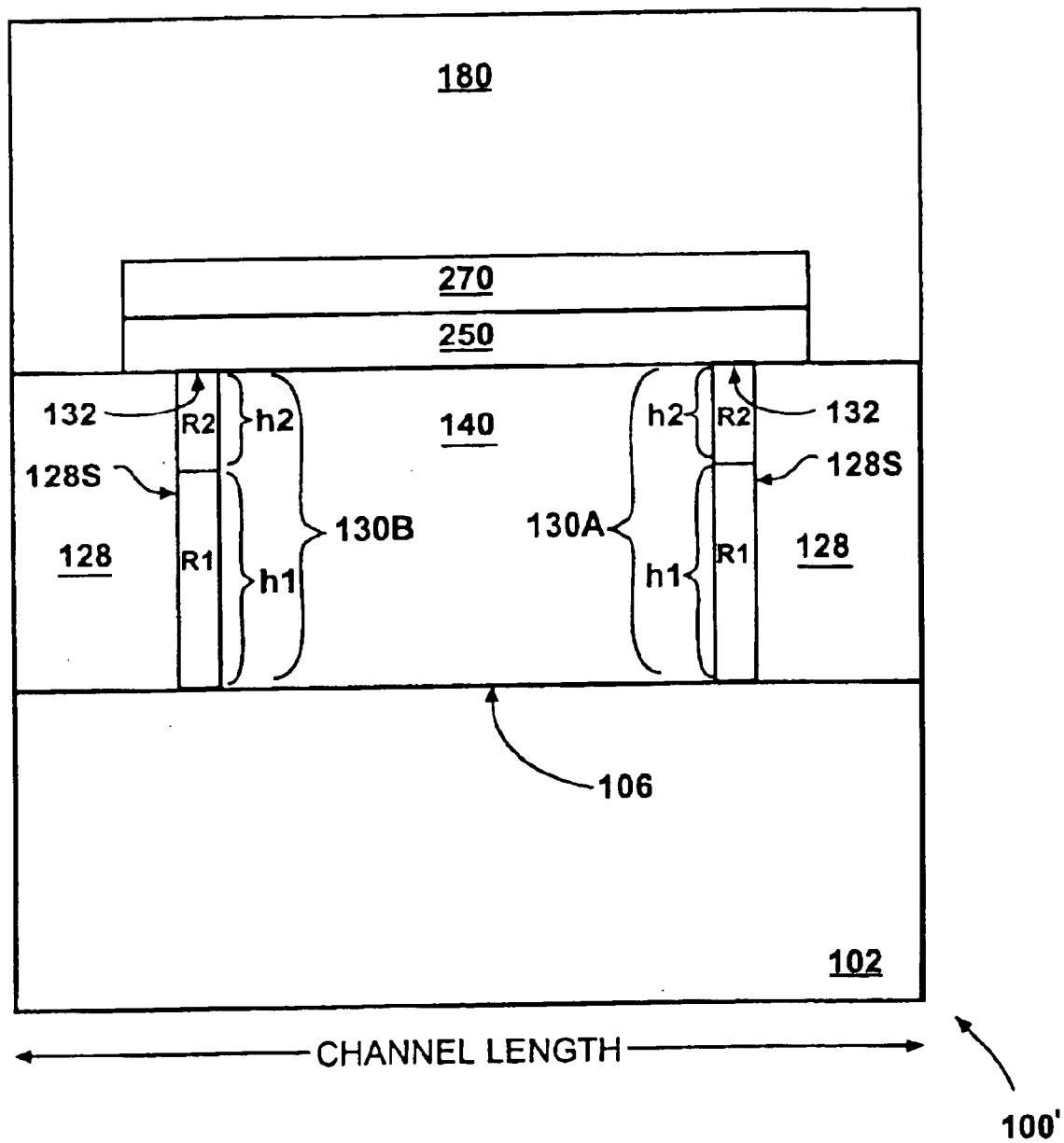
FIG. 1A is a cross sectional view of a memory device of the present invention comprising multi-region conductive sidewall spacers.

FIG. 1A is an example of this first embodiment. Shown is a cross-sectional view of a memory device 100 of the present invention formed on a semiconductor substrate 102. The "channel length" of the memory device 100 is parallel to the plane of the illustration. The "channel width" of the memory device (not shown in FIG. 1A) is perpendicular to the plane of the illustration. In the example shown, the memory device 100 comprises two independent single-cell memory elements. The first memory element comprises a first contact 130A, a layer of memory material 250 and a second contact 270. The second memory element comprises a first contact 130B, a layer of memory material 250 and a second contact 270.

In the example shown, the volume of memory material is a substantially horizontally disposed layer of memory material 250. As shown, the layer of memory material 250 and the second contact 270 are shared by the first and second memory elements. However, other embodiments are possible where each memory element has a unique corresponding volume (or layer) of memory material and a unique corresponding second contact. The dielectric region 140 electrically isolates the electrical contact 130A from the electrical contact 130B. An upper dielectric region 180 is deposited on top of the memory device 100. The upper dielectric layer 180 may comprise boron-phosphate silica glass (BPSG).

Each of the electrical contacts 130A and 130B is in the form of a conductive sidewall spacer. As used herein, reference to the "conductive sidewall spacer 130A,B" (in the singular) refers to either conductive spacer 130A or conductive spacer 130B. Reference to the "conductive sidewall spacers 130A,B" (in the plural) refers to both conductive spacers 130A and 130B of device 100.

In the example shown, each conductive sidewall spacer 130A,B is "single-layered". That is, each conductive spacer 130A,B is a single, substantially vertically disposed, sidewall layer. Each sidewall layer may be formed by the substantial conformal deposition of a suitable contact material onto a sidewall surface 128S. (In FIG. 1, sidewall surfaces 128S and bottom surface 106 form a trench extending perpendicular to the plane of the illustration of FIG. 1A). A "single-layered" conductive spacer is distinguishable from a "multi-layered" conductive spacer where one or more additional sidewall layers are substantially conformally deposited onto the surface of an existing sidewall layer. (Of course, contacts in the form of multi-layered conductive spacers are also possible).

In the example shown in FIG. 1A, the layer of memory material 250 is deposited onto the conductive spacer 130A,B so that only the top end 132 of the conductive spacer 130A,B is adjacent to the memory material 250. The remainder of the conductive spacer is remote to the memory material. Hence, substantially all electrical communication between the conductive spacer 130A,B and the memory material 250 is through the top end 132 of the conductive spacer. As used herein, the terminology "above" and "below" as well as the terminology "top" and "bottom" are defined in terms of relative distances from the substrate. The terminology is independent of the orientation of the substrate.

In the embodiment in FIG. 1A, the top end of the conductive spacer 130A,B is an edge of the conductive spacer (i.e., the "top edge"). An example of an edge of a layer is a surface substantially parallel to the thickness dimension of the layer (where the thickness is preferably the layer's smallest dimension). In the embodiment shown in FIG. 1A, the conductive sidewall spacer 130A,B is a substantially vertically disposed sidewall layer. Hence, the thickness "t" of the conductive spacer 130A,B, as shown in FIG. 1A, is the dimension of the sidewall layer substantially parallel to the channel length, and the top edge 132 is a surface substantially parallel to the substrate 102.

Figure 1B:
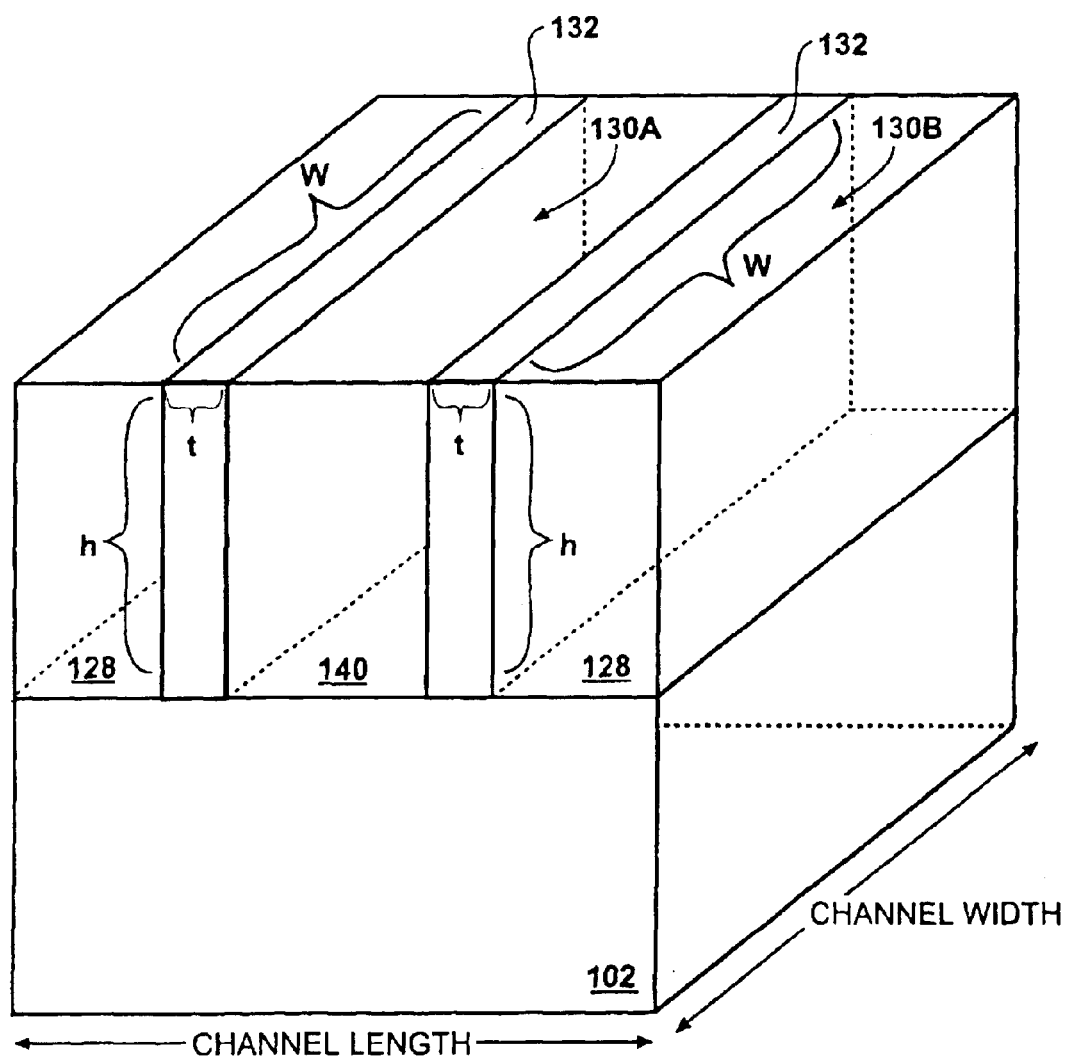
FIG. 1B is a three-dimensional view of a portion of the memory device shown in FIG. 1A.

FIG. 1B is a three-dimensional view of the conductive spacer 130A,B showing its thickness "t", width "w" and a height "h". As noted above, the thickness "t" of the conductive sidewall spacer 130A,B is the dimension of the spacer along the channel length (parallel to plane of the illustration). The width "w" is the dimension of the conductive spacer along the channel width (perpendicular to the plane of the illustration of FIG. 1A). The height "h" is the distance above the substrate 102.

The top edge 132 of each conductive spacer 130A,B is adjacent to the memory material 250 while the remainder of each conductive spacer is remote to the memory material. Hence, substantially all electrical communication between the conductive spacer 130A,B and the memory material 250 is through at least a portion of the top edge 132. That is, substantially all electrical communication is through all or a portion of the top edge 132. It is noted that the top edge 132 need not be in actually contact with the memory material.

In the embodiment shown in FIG. 1A, the memory material 250 is adjacent to the entire top edge 132 of both conductive spacers 130A,B. However, in an alternate configuration it is possible to position the layer 250 of memory material so that it is adjacent to the top edge 132 of only one of the conductive spacers. In yet another configuration, it is possible to position the layer 250 of memory material so that only a portion of the top edge 132 of one or both of the conductive spacers 130A,B is adjacent to the memory material.

Figure 1C:
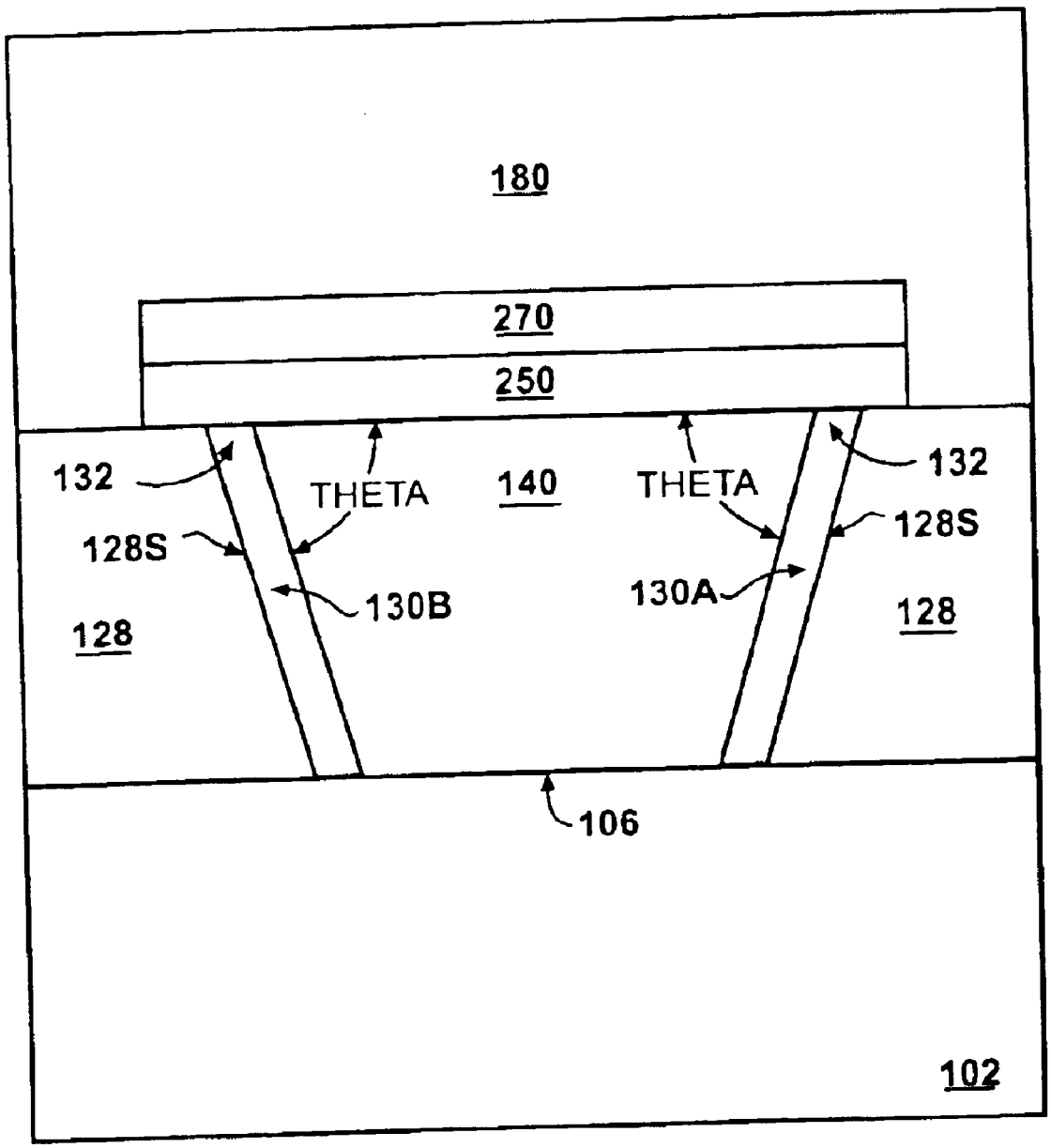
FIG. 1C is a cross sectional view of a memory device of the present invention having angled multi-region conductive sidewall spacers.

In the embodiment shown in FIG. 1A, the conductive spacers 130A,B are sidewall layers which are substantially vertically disposed and thus substantially perpendicular to the layer of memory material 250 and to the substrate. It is, of course, also possible that the conductive spacers 130A,B be "tilted" so that they are not substantially perpendicular to the memory material. As shown in FIG. 1C, the sidewall layers 130A,B may be formed on "angled" sidewall surfaces 128s (for example, the sidewall spacers 130A,B could be formed in a V-shaped trench). This type of structure is also within the spirit and scope of the present invention. The surfaces 132 shown in FIG. 1C (substantially parallel to the substrate) are also considered "edges" of the conductive sidewall spacers 130A,B of FIG. 1C.

As seen, the layers 130A,B form an angle of incidence "THETA" with the layer of memory material 250. Preferably, THETA is greater than 30° and less than 150°. More preferably, THETA is greater than 45° and less than 135°. Most preferably, THETA is greater than 60° and less than 120°.

It is further noted that yet other configurations are possible where the memory material is positioned adjacent to the bottom edge or a portion of the bottom edge of the conductive spacer. In yet another configuration, it is possible that the memory material is adjacent only to a side edge or a portion of a side edge of one or both of the conductive spacers. Referring again to FIG. 1B, the "side edges" of each conductive spacer 130A,B are the surfaces defined by the thickness "t" and the height "h".

Hence, it is preferable that the conductive spacer is "edgewise adjacent" to the memory material. That is, only an edge or a portion of an edge of the conductive spacer 130A,B is adjacent to the memory material. Substantially all of the remainder of the conductive spacer is remote to the memory material. Preferably, substantially all of the electrical communication between the conductive sidewall spacer is through an edge of the conductive spacer or a portion of an edge. That is, it is preferable that substantially all electrical communication is through at least a portion of an edge (i.e., an "edge portion") of the conductive sidewall spacer.

As used herein the terminology "area of contact" is the portion of the surface of an electrical contact through which the electrical contact electrically communicates with the memory material. As noted, it is preferable that substantially all electrical communication between the memory material 250 and a conductive sidewall spacer 130A,B occurs through all or a portion of an edge of the conductive spacer (for example, through all or a portion of the top edge 132). Hence, the area of contact between the conductive spacer 130A,B and the memory material 250 is an edge of the conductive sidewall spacer or a portion of an edge of the conductive sidewall spacer. That is, the area of contact between the conductive spacer and the memory material is an "edge portion" of the conductive sidewall spacer. It is again noted that the conductive spacer need not actually physically contact the memory material. It is sufficient that the conductive spacer is in electrical communication with the memory material. The area of contact, being only an edge portion (i.e., an edge or a portion of an edge) of the conductive spacer, is thus very small and is proportional to the thickness of the conductive spacer.

While it may be preferable that the conductive sidewall spacers are edgewise adjacent to the memory material, this does not have to be the case. It is conceivable that other embodiments are also possible. For example, the area of contact between the conductive spacer and the memory material may be all or a portion of a side face of the conductive spacer (that is the surface defined by the height "h" and width "w" as shown in FIG. 1B).

In one embodiment of the invention, each of the conductive sidewall spacers 130A,B is multi-regioned. Referring to FIG. 1A, it is seen each single sidewall layer 130A,B comprises at least a first region R1 having a first resistivity and a second region R2 having a second resistivity. The resistivity of the second region R2 is greater than the resistivity of the first region R1. In general, the first and second regions may be positioned anywhere within the conductive sidewall spacer. There are many different ways of positioning the regions within the conductive sidewall spacer. For example, the more resistive second region R2 may be positioned adjacent to the memory material. In addition the less resistive first region may be positioned remote to the memory material.

In another configuration, the more resistive second region may be adjacent to the area of contact between the memory material and the conductive spacer while the less resistive first region may be remote to the area of contact. ("Area of contact" was defined above as the surface portion of the conductive sidewall spacer through which the electrical communication with the memory material occurs).

In yet another configuration, the more resistive second region may be adjacent to an edge of the conductive spacer (for example, the top edge) and the less resistive first region may be remote to this edge. As noted above, the area of contact between the memory material and the conductive spacer may be an edge portion of the conductive spacer. Hence, the more resistive region R2 may be positioned adjacent to the edge portion defining the area of contact and the less resistive region R1 may be positioned remote to the edge portion defining the area of contact.

As discussed above, the conductive spacer may be "edgewise adjacent" to the memory material. That is, only an edge or a portion of an edge—i.e., an edge portion of the conductive spacer 130A,B, is adjacent to the memory material while substantially all of the remainder of the conductive spacer is remote to the memory material. Hence, the more resistive region R2 may be positioned adjacent to the edge portion that is adjacent to the memory material while the less resistive region R1 is positioned remote to this edge portion.

Certain embodiments of the memory element may satisfy more than one of the configurations discussed above. Other configurations are also possible. As discussed above, the present invention is not limited to any specific configuration or configurations. Furthermore, while the possible ways of positioning the first and second regions R1, R2 was discussed in regards to a conductive sidewall spacer, the discussion is applicable to all embodiments of the present invention.

The more resistive second region R2 is a portion of the conductive sidewall layer. Preferably, this portion of the sidewall layer (that is, this "layer portion") includes at least a portion of an edge of the sidewall layer (that is, the more resistive sidewall layer portion R2 preferably includes an "edge portion" of the sidewall layer). In the example shown in FIG. 1A, the more resistive second region R2 is a "top portion" of the conductive spacer that includes the top edge 132 (and remote to substrate 102). That is, it extends from the top edge 132 downwardly (i.e., toward the substrate 102) into the interior of the conductive spacer for some distance "h2" (the "height" of the more resistive section region R2). The distance "h2" is not fixed. It may be very small, for example, between about 10 to about 20 Angstroms. In this case, the more resistive top portion is essentially the surface defined by all or a portion of the top edge. Alternately, the distance "h2" may extend further below the top edge 132 and into the interior of the conductive spacer. For example, the distance "h2" may be about 500 Angstroms to about 600 Angstroms. The height "h2" of the regions R2 are preferably less than about 1000 Angstroms, more preferably less than about 800 Angstroms, and most preferably less than about 600 Angstroms.

The less resistive region R1 is remote to the top edge 132. In the example shown, it extends from the bottom of the first region R2 to the substrate 102. The height "h1" of the first region R1 is indicated in FIG. 1A. The height of regions R1 is preferably less than about 10,000 Angstroms, more preferably, less than about 7,000 Angstroms, most preferably less than about 5,000 Angstroms.

In is noted that in the configuration shown in FIG. 1A, the region R1, region R2 and the memory material are is electrical series. It is further noted that in the embodiment shown in FIG. 1A, conductive sidewall spacer 130A,B comprises only two regions R1 and R2. However, in other embodiments, one or both of the conductive spacers 130A,B may comprise more than two regions of material.

Examples of materials which may be used for the more resistive second region R2 include n-type doped polysilicon, p-type doped polysilicon, n-type doped silicon carbon compounds and/or alloys, p-type doped silicon carbon compounds and/or alloys, titanium carbon-nitride, titanium aluminum nitride, titanium silicon-nitride, carbon, and forms of titanium nitride.

Examples of materials which may be used for the less resistive first region R1 include n-type doped polysilicon, p-type doped polysilicon, n-type doped silicon carbide, p-type doped silicon carbide, titanium-tungsten, tungsten silicide, tungsten, molydenum, and titanium nitride.

In the memory device 100 shown in FIG. 1A, each of the conductive sidewall spacers 130A,B delivers electrical current to the memory material. As the electrical current passes through the conductive sidewall spacers and through the memory material, at least a portion of the electric potential energy of the electrons is transferred to the surrounding material as heat. That is, the electrical energy is converted to heat energy via Joule heating. The amount of electrical energy converted to heat energy (that is, the amount of Joule heating) increases with the resistivity of the material as well as with the current density passing through the material.

As discussed above, the conductive sidewall spacers of the present invention may be formed having a more resistive material adjacent to the memory material and a less resistive material remote to the memory material. Hence, there is relatively high power dissipation from Joule heating in region R2 of each conductive spacer adjacent to the memory material. Also, there is relatively low power dissipation from Joule heating in region R1 of each conductive spacer remote to the memory material. The multi-region sidewall spacer may be referred to as a "matchstick" contact. It has a relatively "cooler" bottom portion R1 and relatively "hotter" top portion R2. While not wishing to be bound by theory, it is believed that dissipating power in the electrical contact from Joule heating adjacent to the memory material may at least partially assist (or may even dominate) the programming of the memory material. It is also believed that dissipating power in the electrical contact remote to the memory material may actually waste power and increase the total energy needed to program the memory material. Hence, providing an electrical contact structure having a relatively high power dissipation adjacent to the memory material and a relatively low power dissipation remote to the memory material may thus decrease the total power and energy needed to program the memory device.

Furthermore, as noted above, the conductive sidewall spacer may be edgewise adjacent to the memory material and the area of contact between the memory material and the conductive sidewall spacer may be an edge or a portion of an edge of the conductive spacer. This is a very small area of contact. While not wishing to be bound by theory it is believed that reducing the size of the area of contact reduces the volume of the memory material which is programmed, thereby reducing the total current needed to program the memory device.

Hence, the use of a specially designed "multi-region" conductive sidewall spacer as an electrical contact as well as the unique positioning of the conductive spacer relative to the memory material provides for more efficient heating of the memory material as well as for more efficient use of the total energy supplied to the memory element. Hence, less total energy may be needed to affect a state change in the memory material (that is, less energy may be needed to program the device).

Hence, the multi-region conductive spacer provides a way to increase the flow of the heat energy into the memory material. In order to keep the heat energy within the memory material, a layer of insulation material (not shown) may optionally be placed so that it at least partially surrounds the memory material. For example, referring to FIG. 1A, a layer of insulation material may be disposed in between the memory material 250 and a portion of the second contact 270 to provide a "thermal blanket" for the memory material and serving to keep heat energy within the memory material layer 250.

Figure 1D:
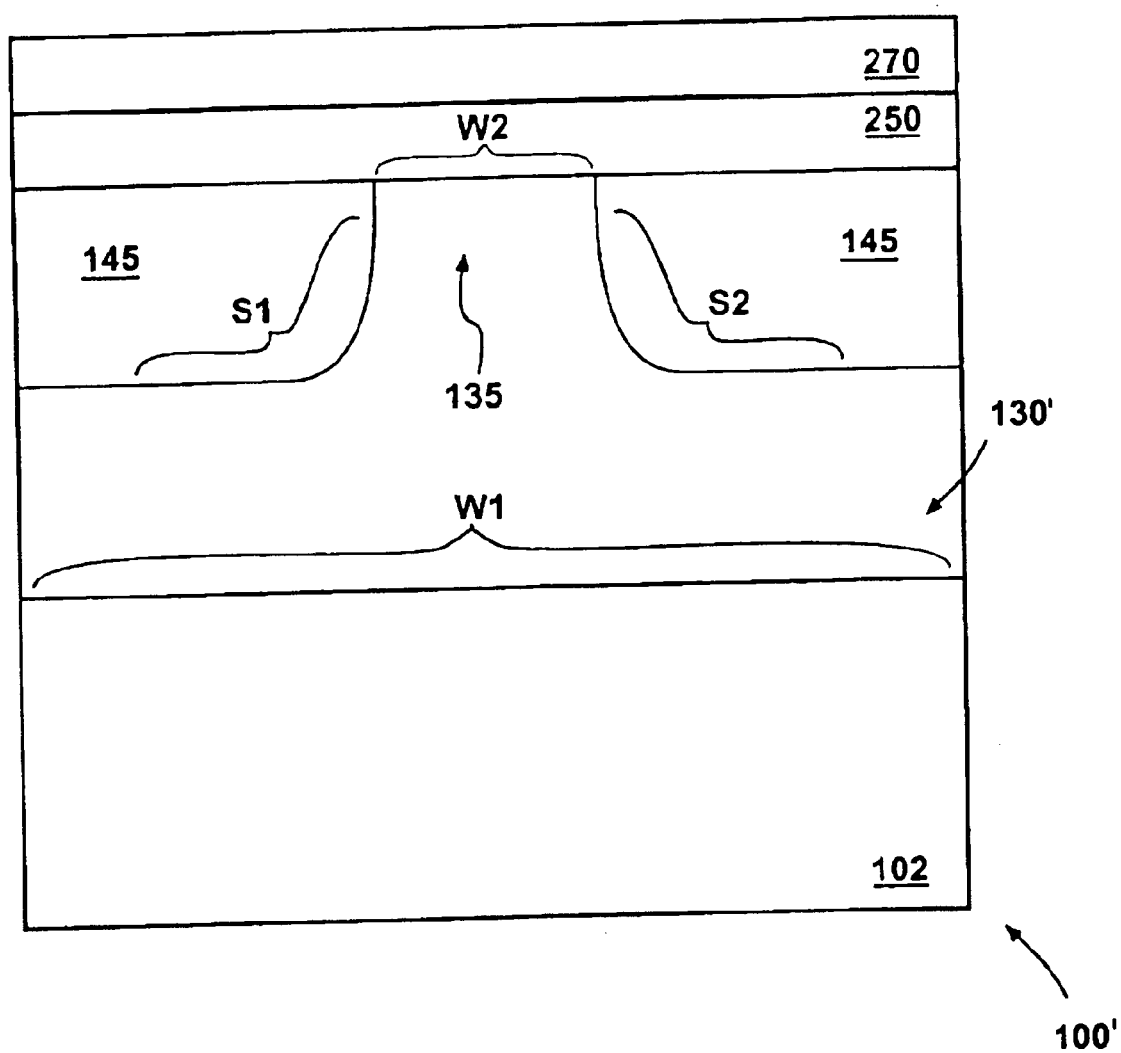
FIG. 1D is a cross sectional view along the channel width of a memory element having a narrowed edge adjacent to the memory material.

In the embodiment of the invention shown in FIGS. 1A and 1B, each conductive sidewall spacer 130A,B has a substantially uniform width "w". In an alternate embodiment of the invention, the conductive spacer may be formed so that the width narrows or tapers adjacent to the memory material (i.e. remote to the substrate). This embodiment, referred to as a "narrowed" or "rapier" conductive spacer, is shown in FIG. 1D. FIG. 1D is a two-dimensional view of a memory device 100' using a "narrowed" conductive sidewall spacer with a "rapier" design. The plane of the illustration is parallel to the channel width of the memory device 100'. As shown, the conductive spacer has been appropriately etched so that its width decreases adjacent to the memory material. In the embodiment shown, the conductive spacer has been appropriately etched to form a columnar portion 135 which protrudes upwardly toward the material 250. The height of the columnar protrusion as well as the extent of any tapering may be controlled to adjust the width w2 adjacent to the memory material. Dielectric material 145 is positioned between the remainder of the conductive spacer 130' and the memory material.

Hence, the width w2 of the conductive spacer adjacent to the memory material is less than the width "w1" of the conductive spacer adjacent to the substrate. The surface portion of the conductive sidewall spacer 130'through which the conductive spacer 130'electrically communicates with the memory material 250 is referred to as the "area of contact" between the conductive spacer 130'and the memory material. In the embodiment shown in FIG. 1D, the area of contact is the surface portion defined by the width "w2" and the thickness "t" of the conductive spacer 130' (the thickness being perpendicular to the plane of the illustration). Decreasing the width "w2" of the conductive spacer adjacent to the memory material and/or decreasing the thickness "t" of the conductive spacer decreases the area of contact with the memory material.

It is noted that in the embodiment shown in FIG. 1D, the area of contact defined by the width "w2" and thickness "t" may be viewed as the "top edge" of the narrowed conductive spacer. Alternately, the area of contact defined by the width "w2" and thickness "t" may be viewed as a portion of the edge defined by segments "s1+w2+S2" and thickness "t". In either case, the area of contact between the conductive spacer 130' and the memory material 250 (that is, the surface portion of the conductive spacer 130' through which substantially all electrical communication occurs) is all or a portion of an edge of the narrowed conductive sidewall spacer 130'.

Figure 1E:
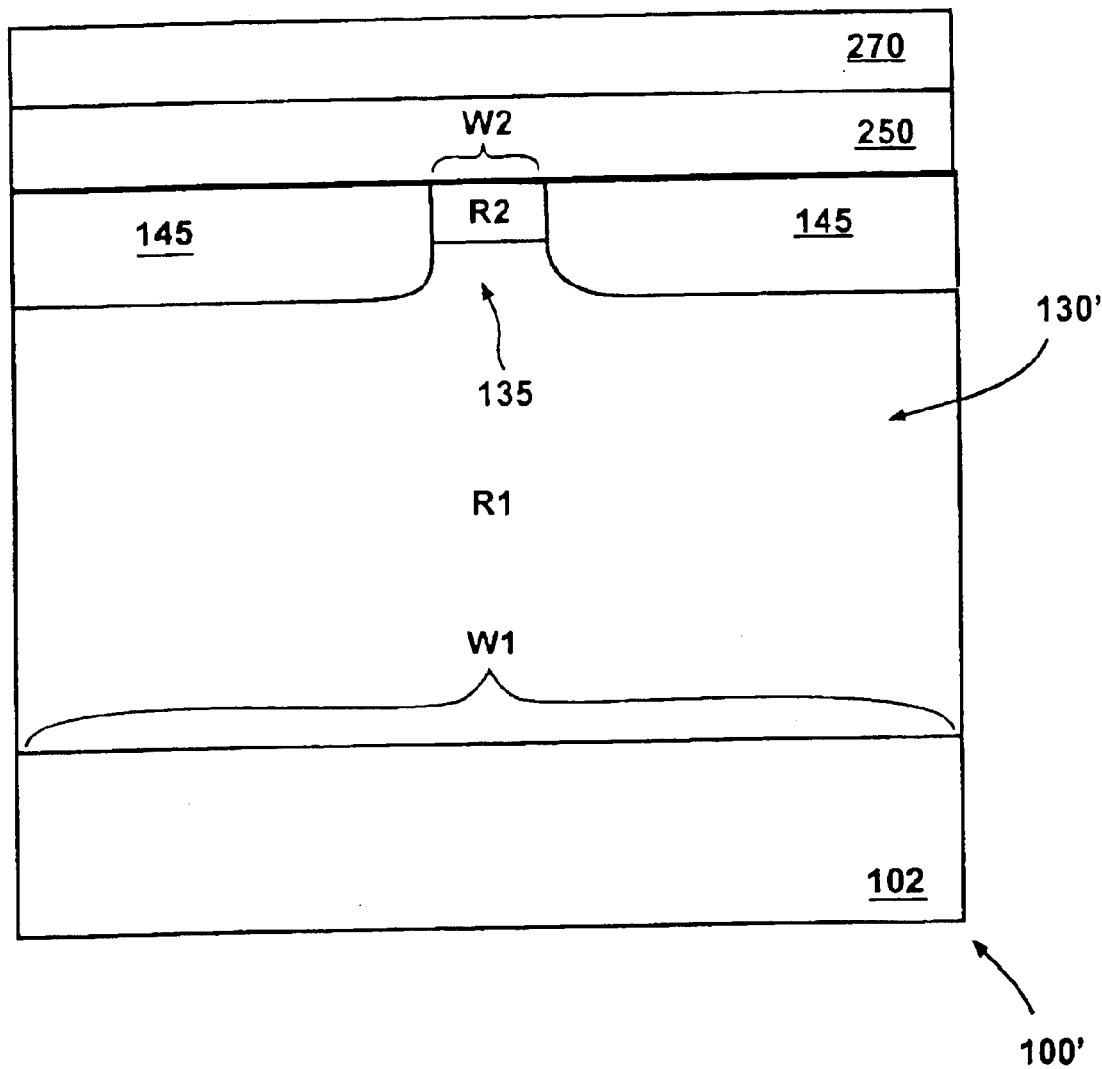
FIG. 1E is the narrowed conductive sidewall spacer of FIG. 1D showing placement of a more resistive region R2 adjacent to the memory material and a less resistive region R1 remote to the memory material.

The narrowed conductive sidewall spacer may also include at least a first region R1 with a first resistivity and a second region R2 with a second resistivity greater than the first resistivity. An example of a specific configuration is shown in FIG. 1E. Referring to FIG. 1E, it is seen that the more resistive region R2 is adjacent to the area of contact (i.e., the surface defined by width "w2" and thickness "t") and the less resistive region R1 is remote to the area of contact. (It is, of course, also the case that the more resistive region R2 is adjacent to the memory material while the less resistive region R1 is remote to the memory material).

The narrowed conductive sidewall spacer 130' may be made by forming an oxide spacer over the conductive spacer 130A,B shown in FIGS. 1A and 1B. Specifically, the oxide spacer is positioned along the width of the conductive spacer where it is desired to position the protruding column 135. The oxide spacer is a mask for either an anisotropic or isotropic etch. That is, the exposed sections of the conductive spacer will be etched away while the section underlying the mask be protected from the etch so as to form the column 135.

Figure 2A:
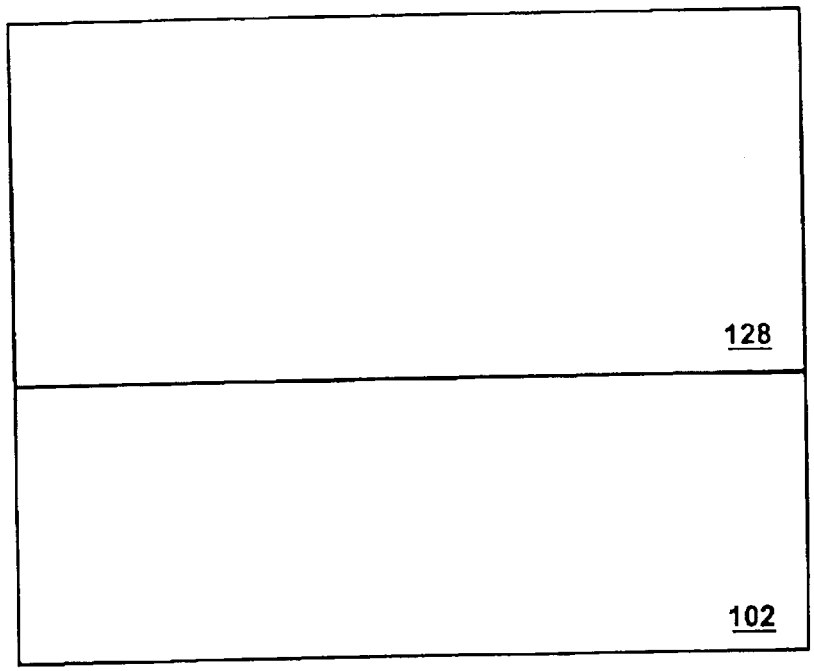
FIGS. 2A–2H show a process for making a memory device having multi-region conductive spacers as electrical contacts.

An embodiment of a method for fabricating the memory device 100 from FIG. 1A is shown in FIGS. 2A–2H. Referring first to FIG. 2A, a substrate 102 is provided and a dielectric layer 128 is deposited on top of the substrate 102 to form the structure 200A shown in FIG. 2A. The dielectric layer 128 may be a dielectric material such as silicon dioxide $SiO_2$ which may be deposited by means such as chemical vapor deposition (CVD).

Figure 2B:
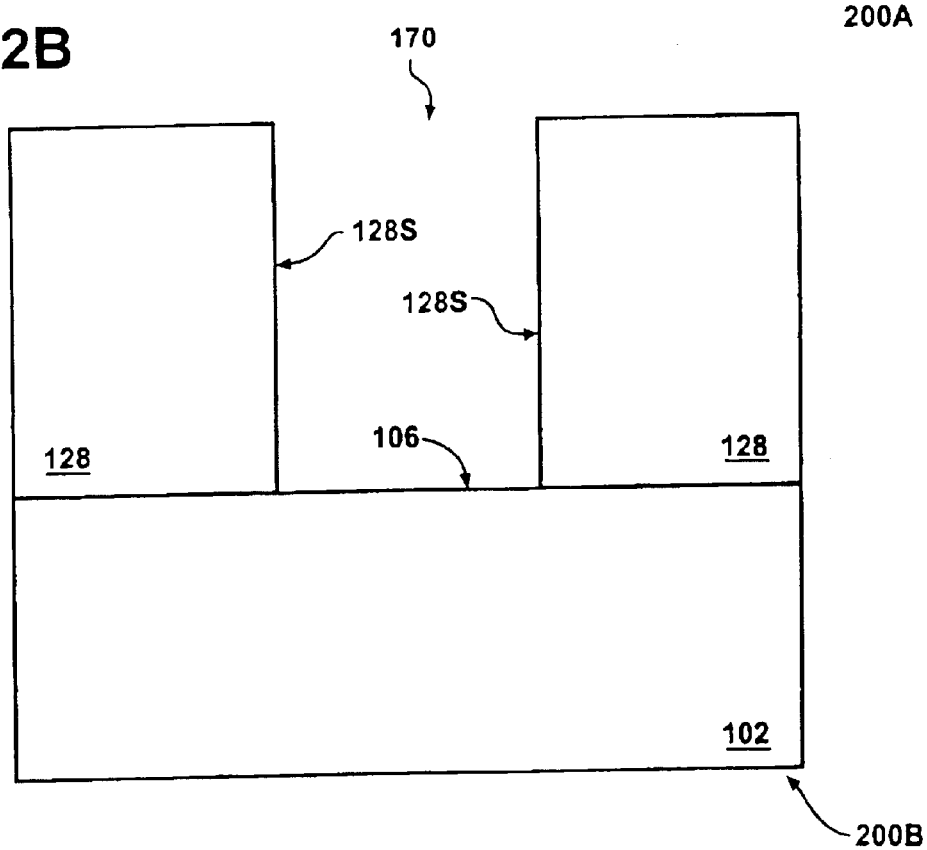

Referring to FIG. 2B, the dielectric layer 128 is then appropriately masked and etched to form the structure 200B having a trench 170 which runs perpendicular to the plane of the illustration. The trench 170 has sidewall surfaces 128S (corresponding to the sidewall surfaces of the dielectric regions 128) and bottom surface 106.

Figure 2C:
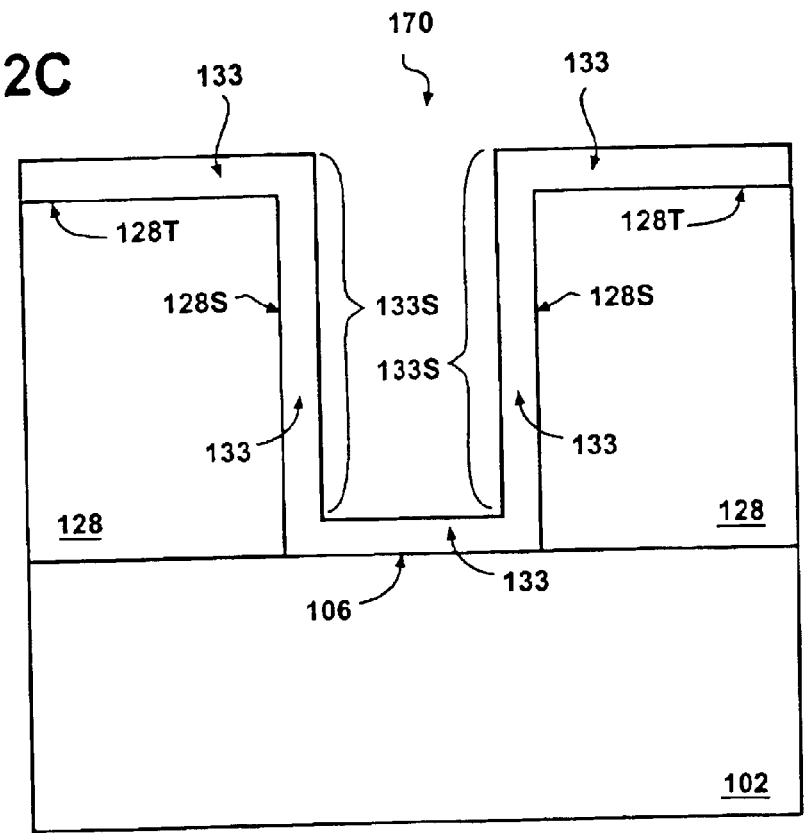

A layer 133 of a contact material is deposited onto the structure 200B to form the structure 200C shown in FIG. 2C. Preferably, the deposition is a conformal deposition. The layer 133 is deposited onto the top surfaces 128T of the dielectric regions 128, onto the sidewall surfaces 128S of the dielectric regions 128, and onto the bottom surface 106 of the trench 170. Hence, portions of the layer 133 are deposited along the two sidewall surfaces 128S of the trench 170. These portions of the layer 133 are sidewall layer portions 133S of the layer 133. The conformal deposition of layer 133 may be done using chemical vapor deposition techniques. Other possible deposition methods may be used as long as the sidewall surfaces 128S are appropriately covered by the layer 133. The material of layer 133 will form the first region R1 of the conductive sidewall spacers 130A,B that are shown in FIG. 1A. Hence, the material used for layer 133 is preferably a conductive material having the appropriate resistivity. Materials which may be used for layer 133 are those which are suitable for the first region R1. As noted above, these materials include n-type doped polysilicon, p-type doped polysilicon, n-type doped silicon carbide, p-type doped silicon carbide, titanium-tungsten, tungsten silicide, tungsten, molydenum, and titanium nitride. The n-type polysilicon may be formed "in situ" by depositing undoped polysilicon in the trench 170 using a CVD process in the presence of phosphene. Alternately, the n-type polysilicon may be formed by first depositing undoped polysilicon and then doping the polysilicon with phosphorous or arsenic. P-type doped polysilicon may be formed by first depositing undoped polysilicon and then doping the polysilicon with boron.

Figure 2D:
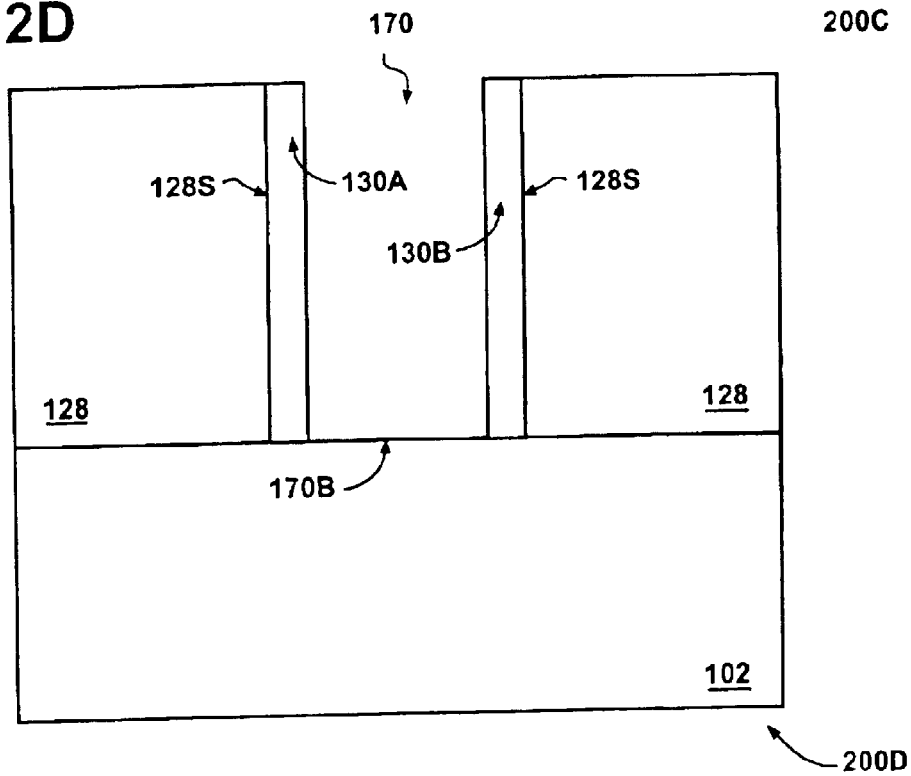

After the layer 133 is conformally deposited it is then anisotropically etched. The anisotropic etch removes those sections of the layer 133 which are substantially horizontally disposed and leaves those sections which are substantially vertically disposed. Specifically, the anisotropic etch removes the substantially horizontally disposed sections of the layer 133 that were deposited on top surfaces 128T of the regions 128. It also removes the substantially horizontally disposed section of the layer 133 deposited onto the bottom surface 106 of trench 170. The anisotropic etch leaves those sections of the layer 133 conformally deposited along the sidewall surfaces 128S. Hence, the anisotropic etch leaves the sidewall layer portions 133S of the layer 133. The results of the anisotropic etch are shown as structure 200D in FIG. 2D. The remaining sidewall layers 133S form the conductive sidewall spacers. At this point in the process, each of the conductive spacers comprises only the single sidewall layer 133S and each sidewall layer 133S comprises only a single region of material. In FIG. 2D, the remaining sidewall layers 133S are shown as conductive sidewall spacers 130A,B.

Assuming that the layer 133 conformally coats the surfaces onto which it is deposited, the conductive sidewall spacers 130A,B will have a lateral thickness substantially equal to the selected thickness of the layer 133. Preferably, the layer 133 is deposited so that the resulting conductive sidewall spacers 130A,B have a substantially uniform thickness between about 50 and about 1000 Angstroms, and more preferably between about 100 and about 500 Angstroms. (However, it is possible that the thickness of the deposited sidewall layers is nonuniform).

The conductive sidewall spacers 130A,B shown in FIG. 2D extend continuously along the width of the trench 170 (i.e perpendicular to the plane of the illustration of FIG. 2D). The next step in the process is to mask and etch the conductive sidewall spacers 130A,B so as to form a plurality of individual conductive sidewall spacers along the width of the memory array. These conductive spacers define individual memory elements along the channel width of the memory array.

Figure 2E:
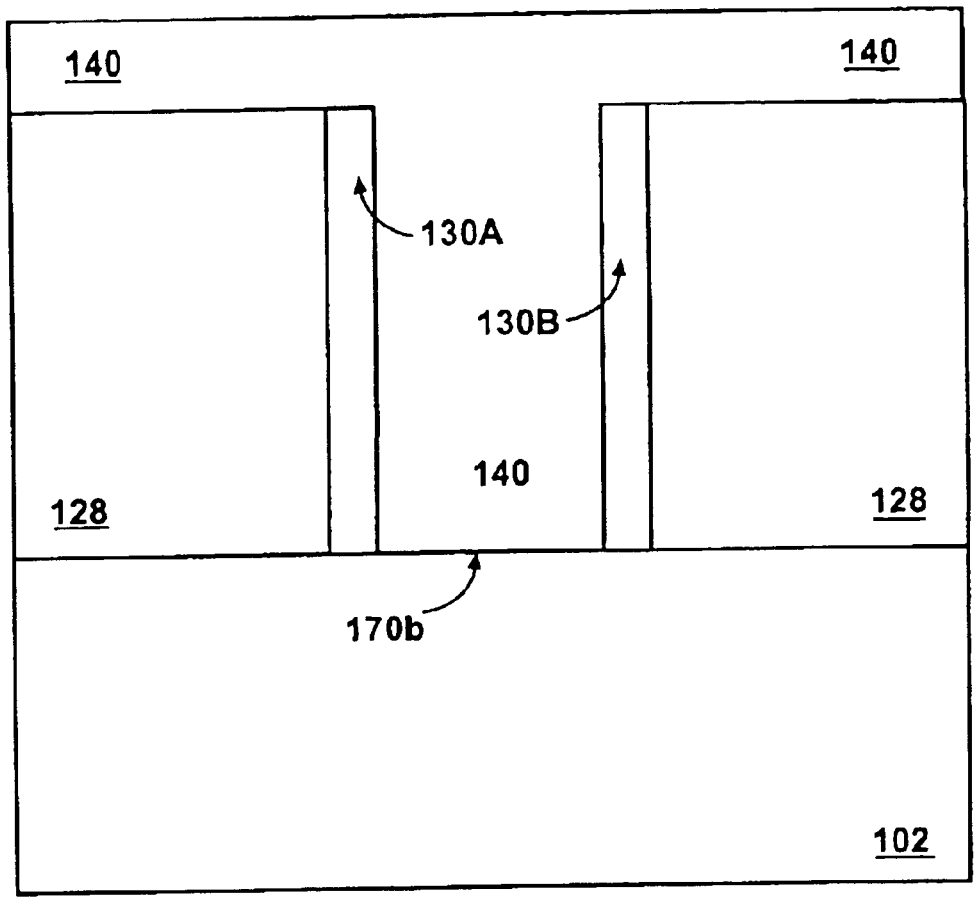

The next step in the process is to fill the trench region 170 with a dielectric material such as silicon dioxide $SiO_2$. This may be done by depositing the dielectric material 140 onto the structure 200D to form structure 200E that is shown in FIG. 2E. The dielectric material 140 is deposited into the trench 170 as well as onto the top surfaces of the dielectric regions 128. The deposition may be done using a chemical vapor deposition process. The structure 200E may then chemically mechanically polished (CMP) or dry etched to form the structure 200F shown in FIG. 2F. The chemical mechanical polishing or dry etching preferably planarizes the top surfaces of the conductive spacers to form top edges 132 which are substantially planar (as shown in FIG. 2F).

Figure 2F:
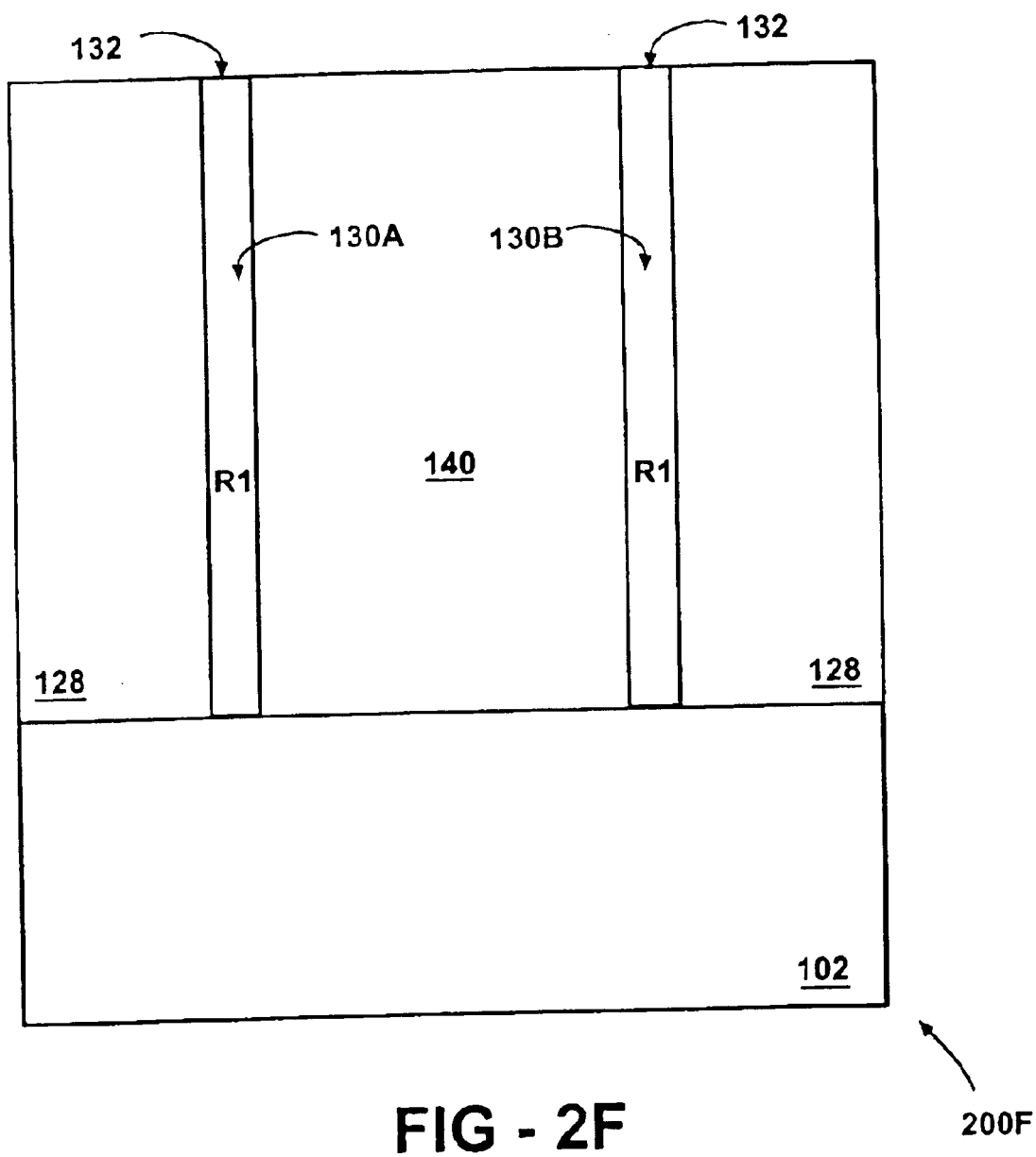

The conductive sidewall spacers 130A,B shown in FIG. 2F were formed by the deposition and anisotropic etch of a single layer of material (i.e., layer 133 shown in FIG. 2C). Hence, each conductive spacer 130A,B shown in FIG. 2F is a single sidewall layer comprising a single region of material. This region of material is denoted as the first region R1 in FIG. 2F.

A second region R2 (as seen in FIG. 1A), having a greater resistivity than region R1, may be formed in each of the conductive spacers 130A,B in several different ways. The approach used depends, at least in part, on the material of region R1. One way of forming the second region R2 is to alter a portion of the region R1 of each conductive spacer 130A,B so as to increase the resistivity of the R1 material. Preferably, a "top portion" of the conductive spacer is altered. "Top portion" refers to a section of the conductive sidewall spacer starting from the top edge 132 (or a portion of the top edge 132) and extending downwardly (i.e., toward the substrate) into the interior of the conductive sidewall spacer. Hence, a top portion of the conductive sidewall spacer includes all or a portion of the top edge 132 of the conductive spacer. Generally, any method of increasing the resistivity of the material is within the spirit and scope of this invention.

The resistance of the material may be increased using ion implantation techniques and/or by appropriately doping the material (introducing dopants into the material). This alters the dopant level of the material. For example, the second region R2 may be formed by appropriately "counter-doping" a top portion of the region R1 of each conductive spacer 130A,B shown in FIG. 2F. In particular, if the regions R1 were formed from an n-type polysilicon, then a top portion of each region R1 may be counter-doped with boron (by well known ion implantation techniques) to form regions R2 having a resistivity which is greater than the resistivity of regions R1. If the n-type polysilicon of region R1 is lightly counter-doped with boron, then a region R2 may be formed which comprises n-polysilicon. If the n-type polysilicon of region R1 is more heavily counter-doped with boron, then a region R2 may be formed which comprises p-polysilicon.

Likewise, if the regions R1 were formed from a p-type polysilicon, then a top portion of each region R1 may be counter-doped with phosphorous to form regions R2 which also have a resistivity greater than the resistivity of regions R1. If the p-type polysilicon of region R1 is lightly counter-doped with phosphorous, then a region R2 may be formed which comprises p-polysilicon. If the p-type polysilicon of region R1 is more heavily counter-doped with phosphorous, than a region R2 may be formed which comprises n-polysilicon.

Hence, a top portion of the first region R1 may be counter-doped to form a second region R2 which has a higher resistivity than the first region R1. A top portion of the region R1 may be sufficiently counter-doped with boron to form a second region R2 comprising n-polysilicon. Alternately, a top portion of the region R1 may be sufficiently counter-doped with boron to form a second region R2 comprising p-polysilicon. In either case, the second region R2 is doped differently from the first region R1.

Figure 2G:
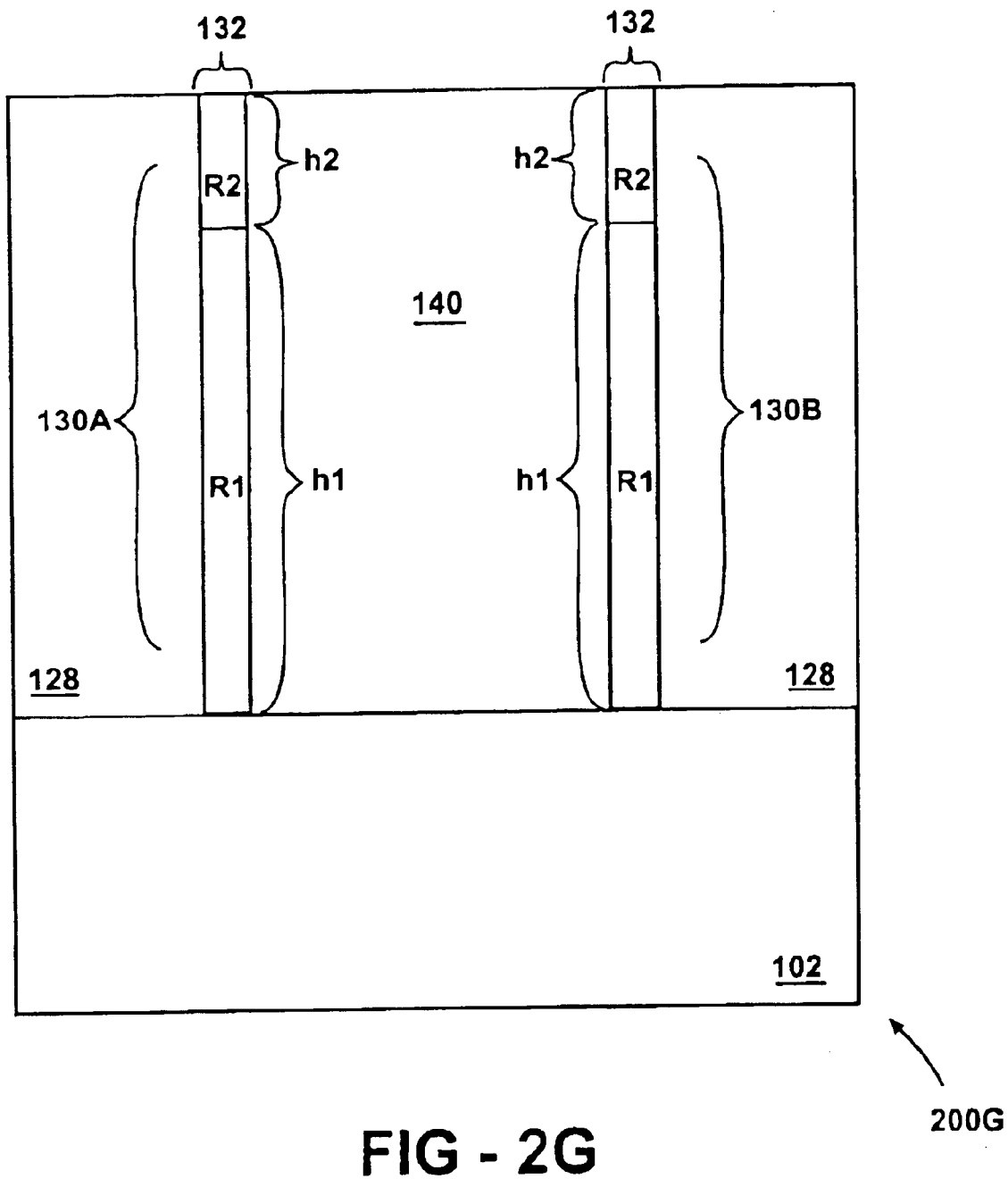

The multi-region conductive sidewall spacers 130A,B comprising a first region of material R1 and a second region of material R2 is shown in FIG. 2G. The more resistive regions R2 start at the top edges 132. The height "h2" of the regions R2 are preferably less than about 1000 Angstroms, more preferably less than about 800 Angstroms, and most preferably less than about 600 Angstroms. The height of regions R1 is preferably less than about 10,000 Angstroms, more preferably, less than about 7,000 Angstroms, most preferably less than about 5,000 Angstroms. Of course, the heights of regions R1 and R2 may vary.

Figure 2H:
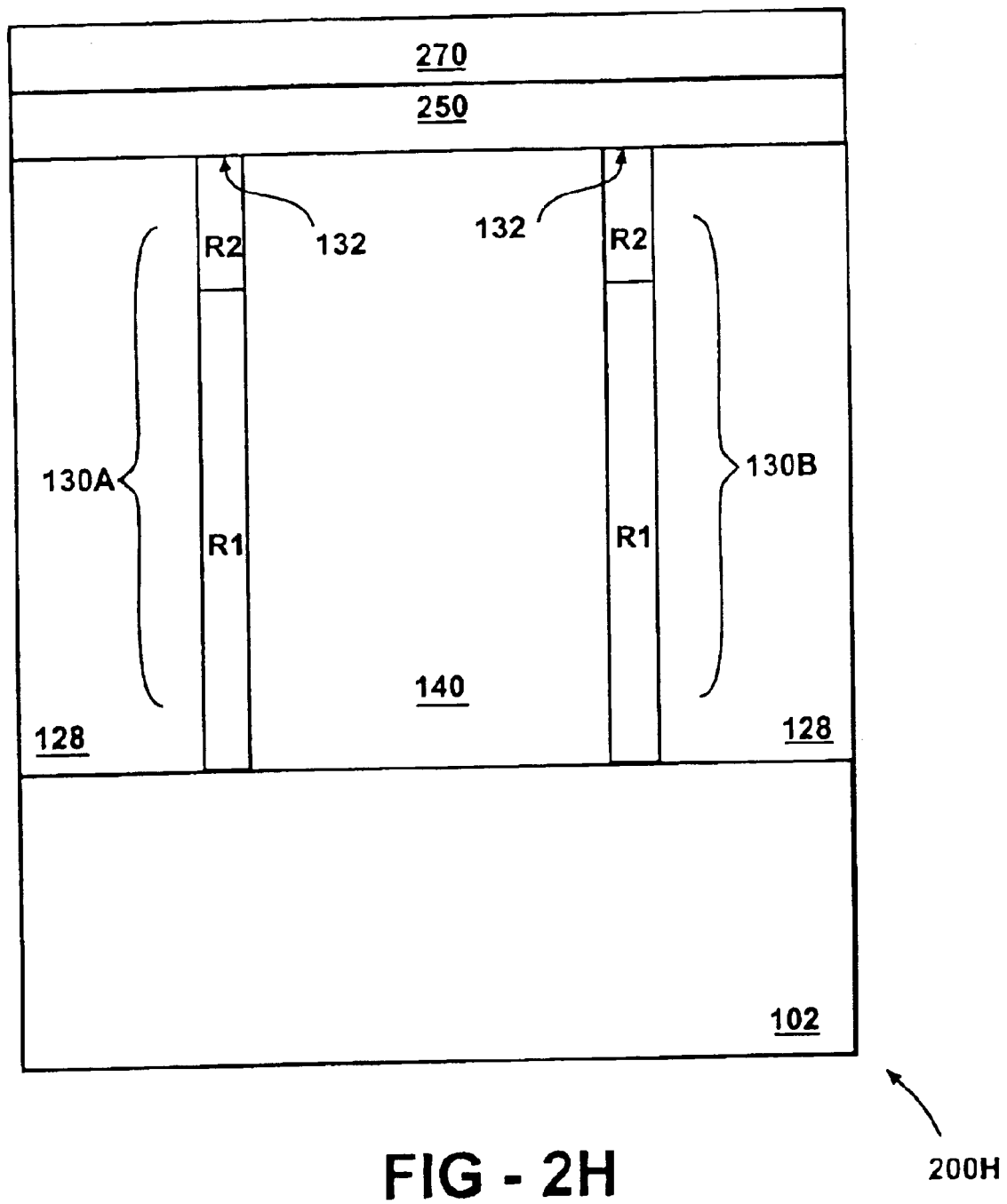
Figure 2A:
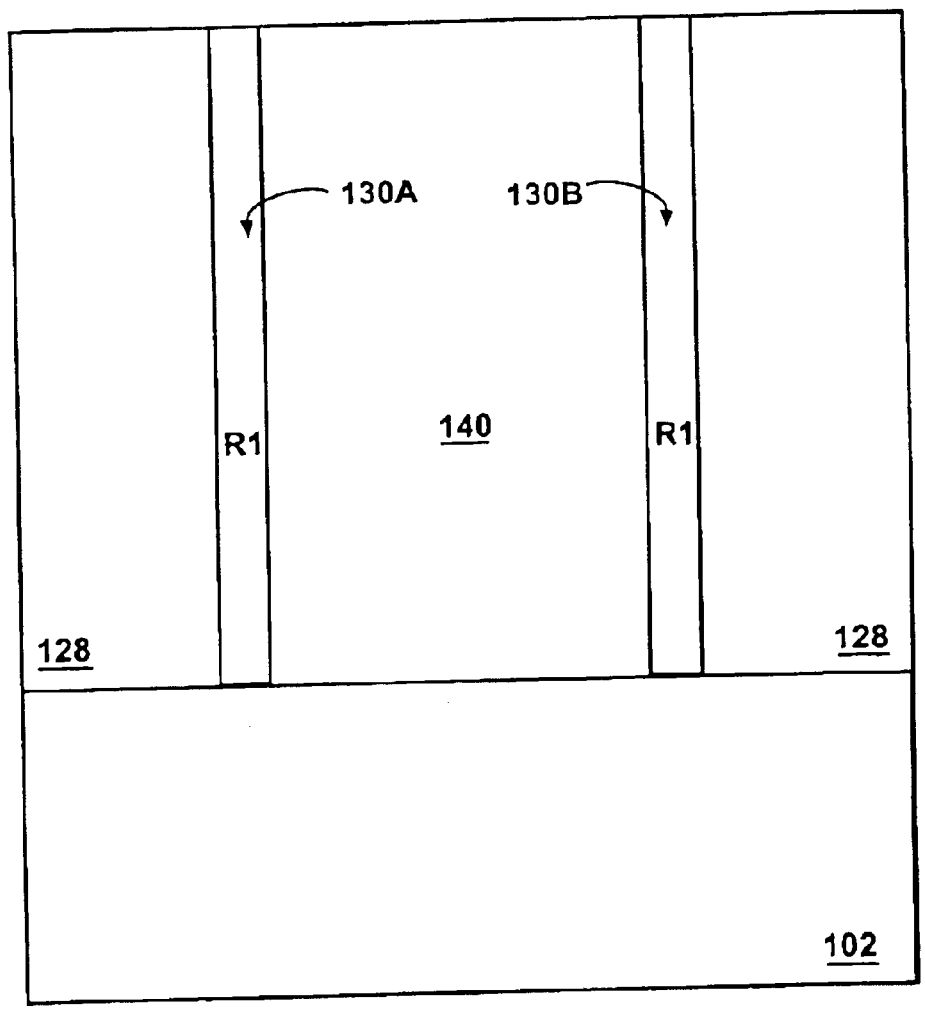
Figure 2B:
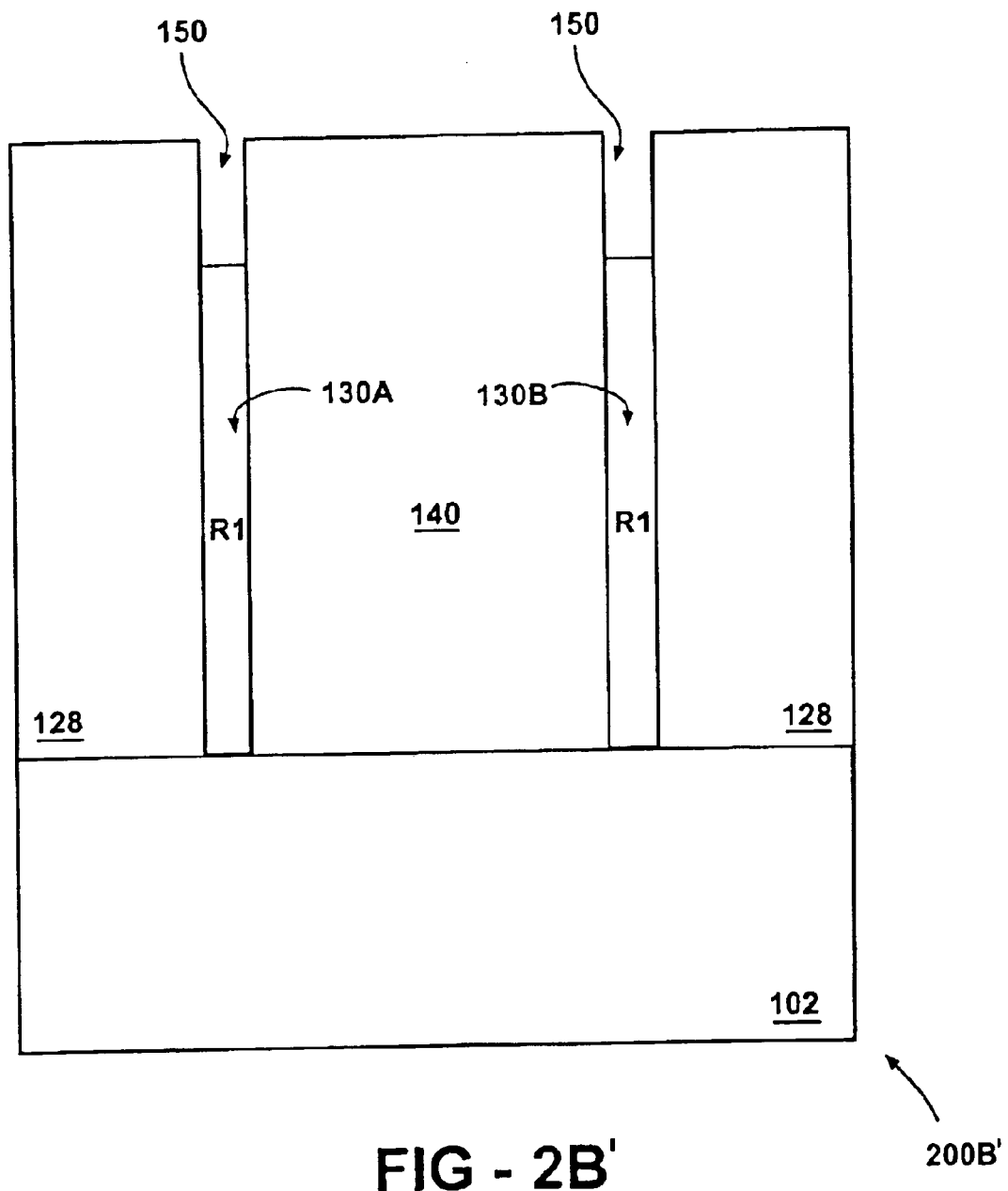
Figure 2C:
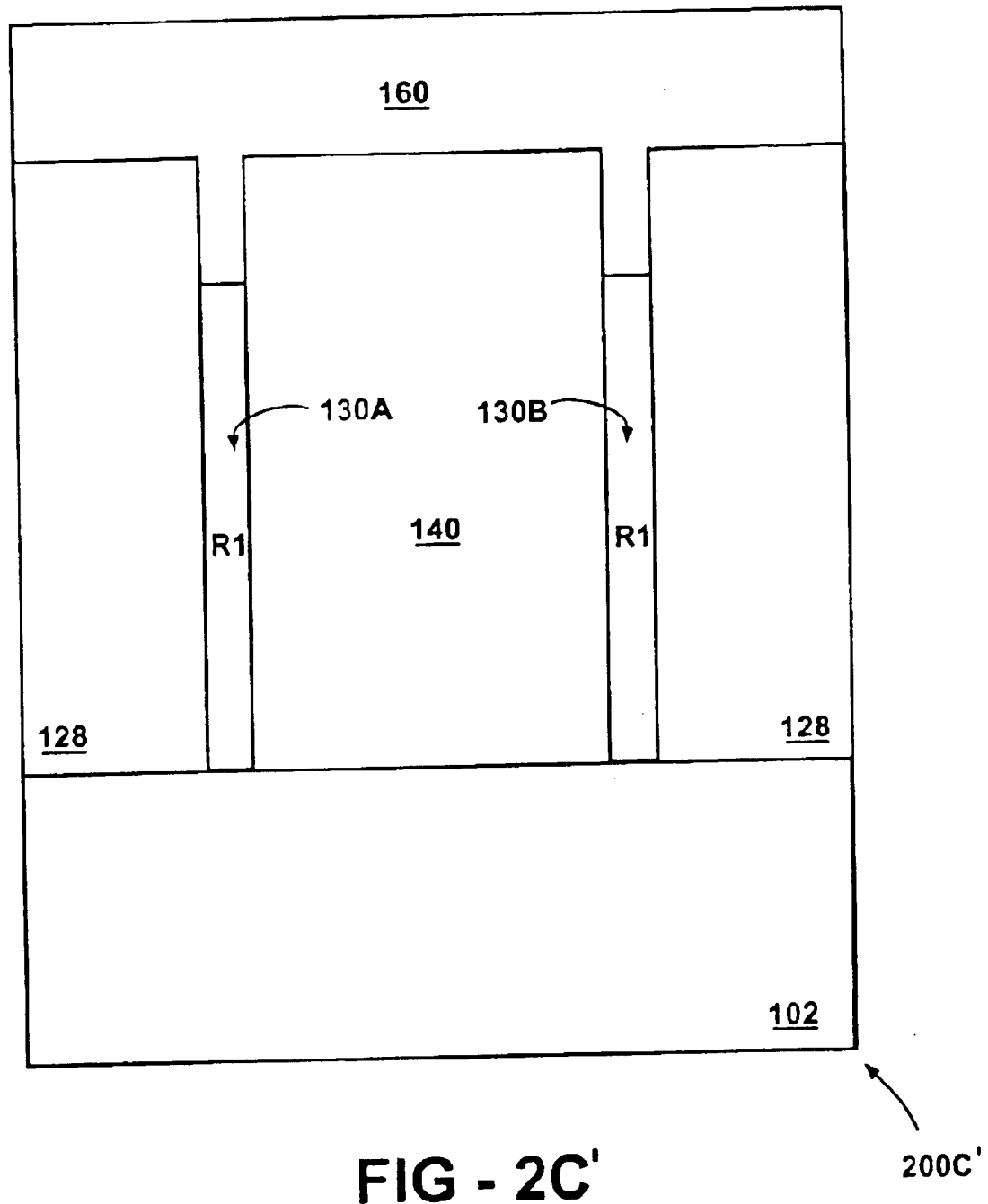
Figure 2D:
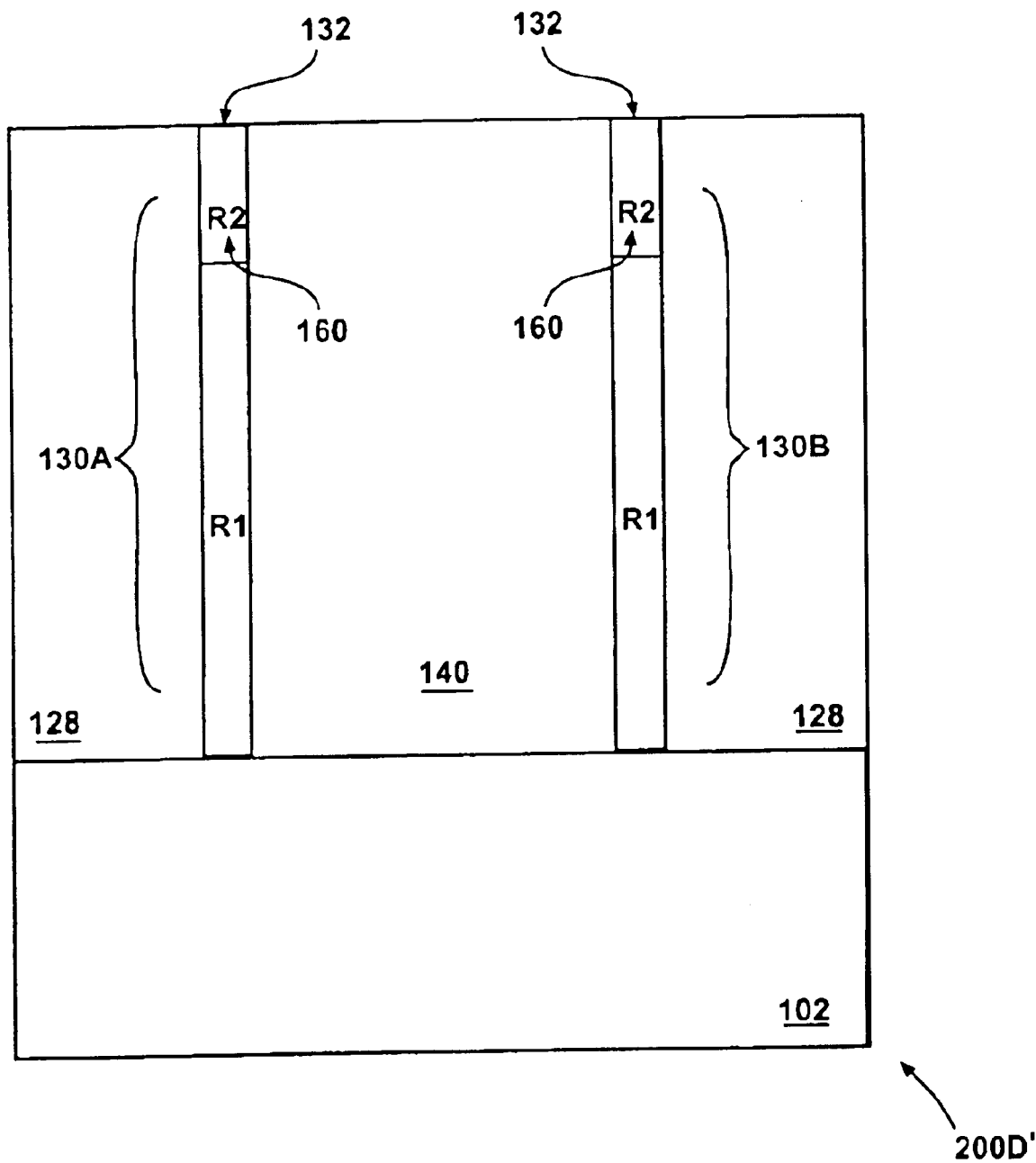

Referring now to FIG. 2H, the structure 200H is formed by depositing a layer of memory material 250 on top of the structure shown in FIG. 2G. A layer of contact material 270 is then deposited on top of the memory layer 250 to form a second contact. While not shown in FIG. 2H, it is possible that the second contact 270 may also be formed to include at least a first region having a first resistivity and a second region having a second resistivity greater than the first resistivity.

It is noted that the deposited memory layer 250 is in contact with only each of the top edges 132 or a portion of each of the top edges 132 of the conductive spacers 130A,B.

Substantially all electrical communication between each conductive spacer 132A,B and the memory material is through the edge 132 or a portion of the edge 132 of the respective conductive spacer.

It is noted that the multi-region conductive sidewall spacers may be made in another way. This is shown in FIGS. 2A'–2D'. The structure 200A' in FIG. 2A' shows conductive sidewall spacers 130A,B comprising a single sidewall layer of material R1 (FIG. 2A' is the same as FIG. 2F). The structure 200A' may be masked and selectively etched to remove a portion (in particular, a top portion) of the conductive sidewall spacers 130A,B so as to create recesses in a top portion of material R1 of each of the conductive spacers 130A,B. Referring to FIG. 2B', the recesses 150 are shown in structure 200B'. The recesses 150 are filled by depositing a layer of material 160 on top of structure 200B' to form the structure 200C' shown in FIG. 2C'. As shown in FIG. 2C', the layer 160 fills the recesses 150 and also lies on top of the dielectric regions 128, 140. The structure 200C' may then be chemically mechanically polished (CMP) or dry etched to form the substantially planar top edges 132 as shown in structure 200D' of FIG. 2D'.

The structure 200D' includes conductive sidewall spacers 130A,B where each of the conductive spacers includes two regions of material—the first region R1 and the second region R2. The regions R2 consist of the material of layer 160 shown in FIG. 2C'. It is noted that the structure shown in FIG. 2D' is the same as the structure shown in FIG. 2G.

The second regions R2 shown in FIG. 2D' may be formed of a material which, without any further modification, has the appropriate resistivity. Preferably, the material chosen for the second region R2 has a resistivity that is greater than the resistivity of the R1 material removed by the etching process to create the recesses 150 (shown in FIG. 2B'). Examples of appropriate materials include n-doped polysilicon, p-doped polysilicon, n-doped silicon carbon compounds and/or alloys, p-doped silicon carbon compounds and/or alloys, titanium carbon-nitride, titanium aluminum nitride, titanium silicon-nitride, carbon, and forms of titanium nitride.

Alternately, the second regions R2 may initially be formed from a material that still needs to be altered to change its resistivity. For example, the second region R2 may be formed from undoped polysilicon (that is, the layer 160 shown in FIG. 2C' may be deposited as an undoped polysilicon). The undoped polysilicon of the second regions R2 may then be doped with boron to form a p-polysilicon region. Alternatively, the undoped polysilicon of the second regions R2 may be doped with a material such as phosphorous or arsenic to form an n-polysilicon region.

In the embodiment of the memory device shown in FIG. 1A an electrical contact for each of the single-cell memory elements in the device is a conductive sidewall spacer. The conductive sidewall spacer 130A,B is a single sidewall layer formed along the sidewall surface of a trench by depositing a layer of conductive material into the trench and then anisotropically etching the layer to remove the horizontally disposed surfaces. The shape of the conductive spacer shown in FIGS. 1A and 1B are in the form of substantially planar sidewall layers.

Alternate forms of electrical contacts may be formed from sidewall layers that are made by the conformal deposition of material onto the other types of sidewall surfaces (that is, sidewall surfaces other that the sidewall surfaces of a trench). For example, a layer of conductive material may be substantially conformally deposited onto the surfaces of a via (a hole), mesa or pillar. The via, mesa or pillar may be round, square, rectangular or irregularly shaped. Anisotropically etching the conformally deposited conductive layer, removes the horizontally disposed portions of the deposited layer and leaves only one or more vertically disposed portions. The remaining one or more vertically disposed portions are sidewall layers in the form of conductive sidewall spacers.

Figure 3A:
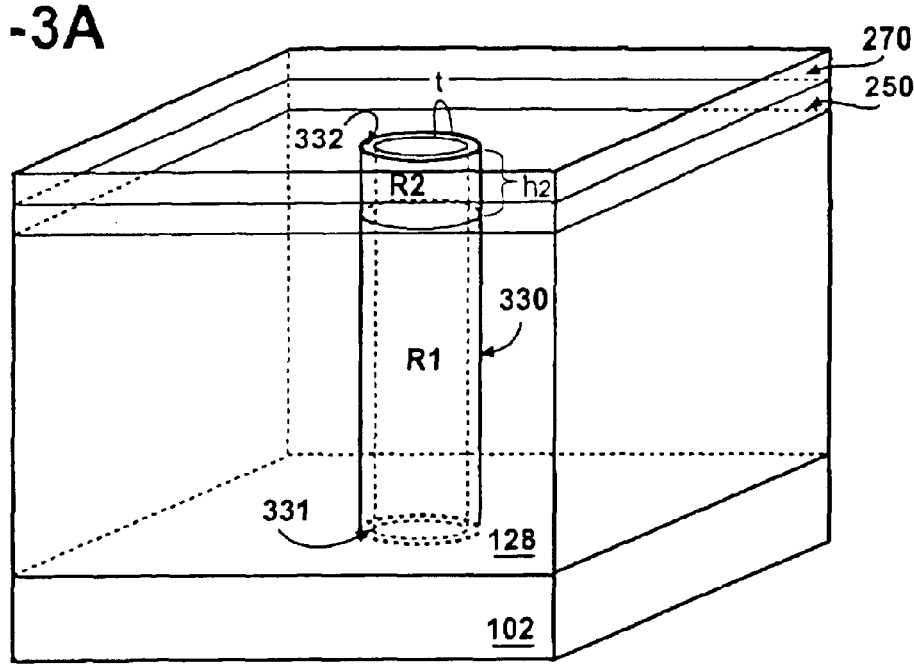
FIG. 3A is a three-dimensional view of a memory device of the present invention having a multi-region cylindrically shaped conductive sidewall spacer as an electrical contact.

The sidewall spacer formed, for example, by the conformal deposition of a conductive material into a cylindrical via (followed by an anisotropic etch) will be in the form of a cylindrical surface (with an axis substantially perpendicular to the substrate) having two open ends. Changing the shape of the via (or pillar or mesa) will change the shape of the sidewall spacer. That is, the lateral cross section of the conductive sidewall spacer (i.e. the cross section parallel to the substrate) corresponds to the shape of the via, mesa or pillar. It may be an annulus. Alternately, it may be rectangular or irregularly shaped. FIG. 3A shows a three-dimensional view of a cylindrical, multi-region conductive sidewall spacer 330 formed in a circular via (and thus having a horizontal cross-section in the shape of an annulus). The cylindrical conductive spacer 330 is "single-layered". That is, it comprises a single, cylindrically shaped sidewall layer. The thickness "t" of this cylindrically shaped sidewall layer is the distance between the inner and outer cylindrical surfaces as shown in FIG. 3A. The cylindrical sidewall layer has two open ends or "rims" forming the top edge 332 and the bottom edge 331. The top and bottom edges 332 and 331 of the cylindrically shaped conductive sidewall layer 330 are annular surfaces formed by intersecting the conductive layer 330 with a planes substantially parallel to the substrate. In the embodiment shown in FIG. 3A, the layer of memory material 250 is adjacent only to the top end of the cylindrical sidewall spacer 330. In particular, the memory material 250 is adjacent only to the top edge 332.

The layer 250 of memory material is deposited on top of the conductive spacer 330 and the second contact layer 270 is deposited on top of the memory material 250. The layer 250 of memory material (which is preferably substantially horizontally disposed) is adjacent only to the top edge 332 or portion of the top edge 332 of the conductive sidewall spacer 330 is adjacent to the memory material 250. All electrical communication between the conductive spacer 330 and the memory material 250 is through the top edge 332 or a portion of the top edge 332. Hence, area of contact between the conductive spacer 330 and the memory material 250 is the edge 332 or a portion of the edge 332. (That is, all or a portion of the annular surface 332).

The conductive spacer 330 comprises at least a first region R1 having a first resistivity and a second region R2 having a second resistivity. The resistivity of the second region R2 is greater than the resistivity of the first region R1. Preferably, the more resistive second region R2 is adjacent to the memory material while the first region R1 is remote to the memory material.

In the example shown in FIG. 3A, the more resistive second region R2 is a "top portion" of the conductive spacer adjacent to the top edge 332 (and remote to substrate 102). That is, it extends from the top edge 332 downwardly (i.e., toward the substrate 102) into the interior of the cylindrical conductive spacer for some distance "h2" (the "height" of the more resistive section region R2).

The regions R1 and R2 of the cylindrically shaped conductive spacer may be formed by methods similar to those used to form the regions R1 and R2 of the "planer" conductive spacer 130A,B shown in FIG. 1A. For example, a more resistive second region R2 may be form by the appropriate ion-implantation techniques. Such ion implantation techniques may be used to appropriately counter-dope the material R1 to form the more resistive material R2. Alternately, the material R1 may first be etched and refilled with a more resistive material R2. Generally, all of the methods and materials described above (with respect to the planar conductive sidewall spacer) are applicable to this embodiment.

Figure 3B:
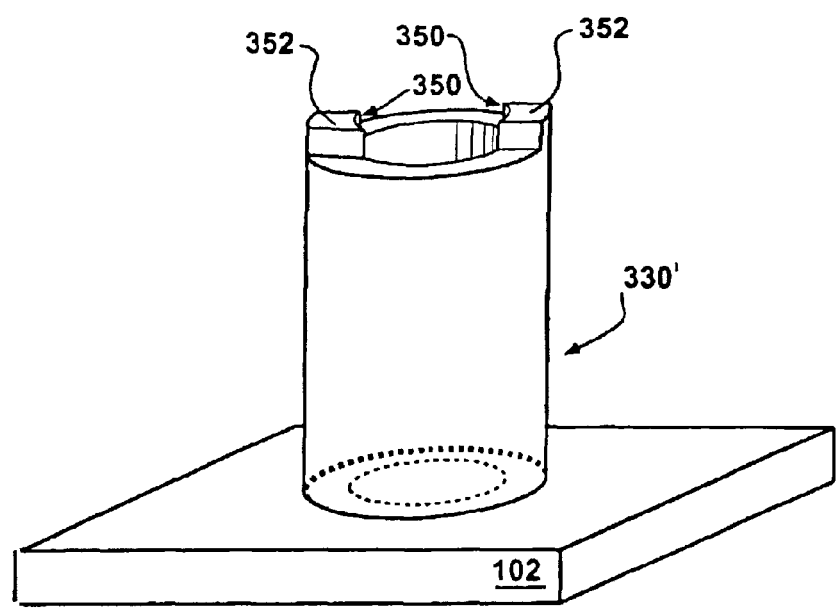
FIG. 3B is a three-dimensional view of cylindrically shaped conductive sidewall spacer with columnar protrusions.

FIG. 3B shows an alternate embodiment of a cylindrical conductive sidewall spacer 330'. This cylindrical conductive sidewall spacer includes at least one columnar portion which protrudes toward the memory material (not shown in this diagram). In the embodiment shown, the columnar portions 350 each have a thickness which is substantially the same as the thickness of the remainder of the conductive spacer. FIG. 3B shows the cylindrical conductive sidewall spacer 330' disposed on top of a substrate 102. Such columnar protrusions may be used with conductive sidewall spacers of all different shapes. The columnar protrusions may be formed with the use of oxide spacers. Preferably, substantially all electrical communication between the conductive spacer 330' and the memory material is through one or more of the tips 352 of the columnar protrusions 350. Hence, the contact 330' and memory material may be positioned so that only the tip(s) 352 of one or more of the columnar protrusions 350 is/are adjacent to the memory material while substantially all of the remaining portion of the contact is remote to the memory material. The columnar protrusions 350 may also include at least a first region R1 with a first resistivity and a second region R2 with a second resistivity greater than the first resistivity. The more resistive region is preferably adjacent to the memory material while the less resistive region is preferably remote to memory material. In the examples of the memory device shown in FIGS. 1A, 1C, 1D and 3A, the conductive sidewall spacer 130A,B (or 330) is adjacent to the memory material such that there are no "intermediate" layers disposed between the memory material and the conductive sidewall spacer 130A,B (or 330).

Figure 1F:
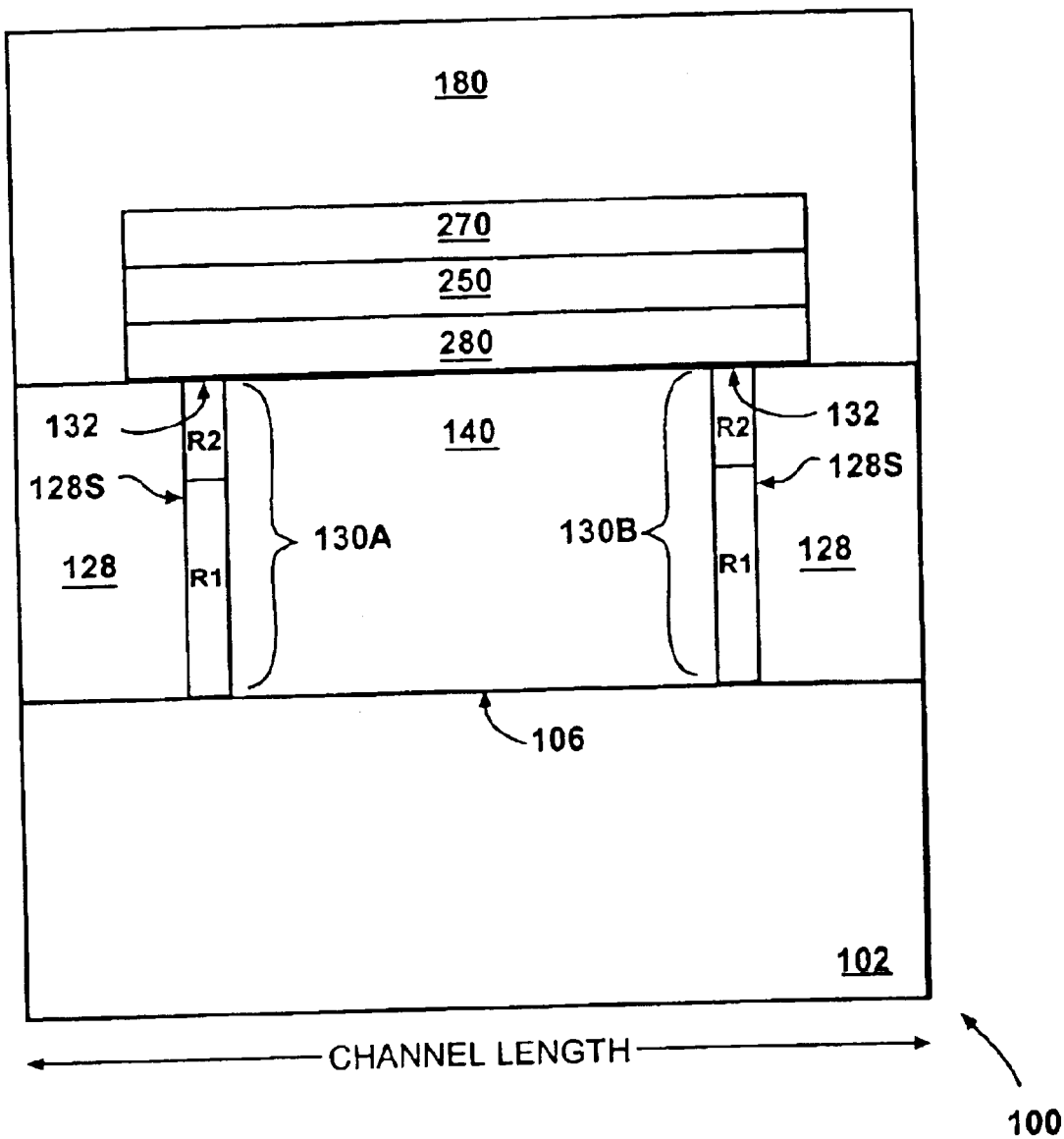
FIG. 1F shows a memory device having an intermediate layer disposed between the memory material and the conductive sidewall spacers.
Figure 1G:
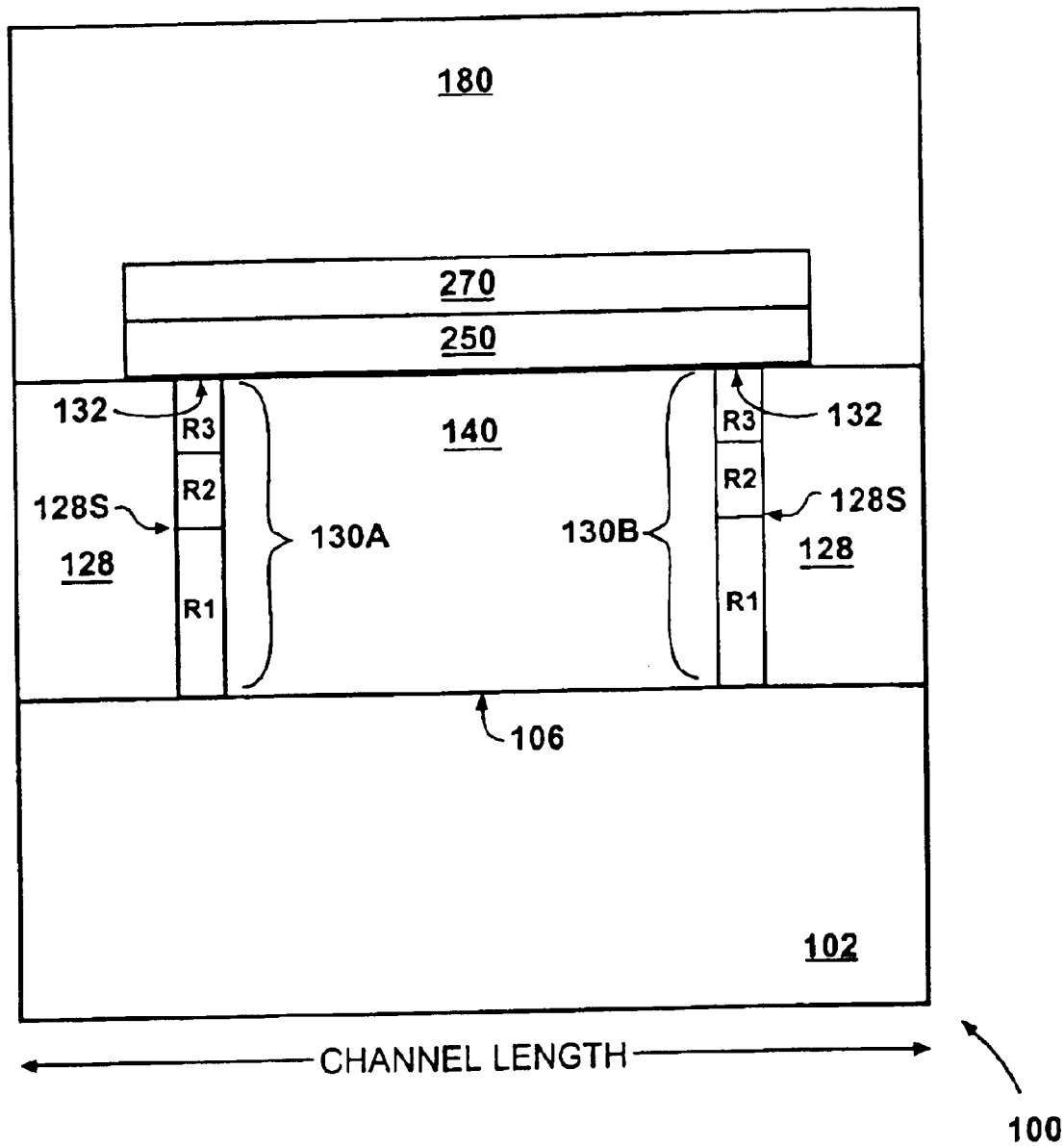
FIG. 1G shows a memory device wherein the conductive sidewall spacers have an additional region R3 adjacent to the memory material.

In an alternate embodiment of the present invention, it is possible that one or more intermediate layers exit between the conductive sidewall spacer and the memory material. This is shown in FIG. 1F, where an intermediate layer 280 is disposed between the memory layer 250 and the conductive sidewall spacer 130A,B. It is noted that, in this embodiment, it is still the case that substantially all electrical communication between the memory material 250 and the conductive sidewall spacer 130A,B is through the top edge 132 or a portion of top edge 132 of the conductive spacer 130A,B even though the layer 280 is disposed between the memory material 250 and the conductive spacer 130A,B. Furthermore, in the configuration shown in FIG. 1F, the more resistive second region R2 is adjacent to the area of contact (which is top edge 132) while the less resistive first region R1 is remote to the area of contact (which is top edge 132). Also, it is seen that the more resistive second region R2 is positioned closer to the memory material 250 than the less resistive first region R1. That is, the second region R2 is "proximate to" the memory material while the first region R1 is "distant from" the memory material.

In yet another embodiment of the present invention, it is possible that the conductive sidewall spacers (such conductive spacers 130A,B in FIG. 1A or conductive spacer 330 in FIG. 3) comprise one or more regions of material in addition to the more resistive second region R2 and the less resistive first region R1. In the embodiment shown in FIG. 1G, the conductive sidewall spacers 130A,B each comprise a third region R3 disposed between the memory material 250 and the second region R2. It is noted that in this embodiment, it is still the case that substantially all electrical communication between the memory material and the conductive sidewall spacer 130A,B is through the top edge 132 or a portion of the top edge 132. In the embodiment shown, the first and second regions R1 and R2 are positioned so that the region R2 is closer to the top edge 132 than region R1. (That is, region R2 is "proximate to" the top edge 132 while the region R1 is "distant from" to the top edge 132). Hence, region R2 is also closer to the area of contact between the conductive spacer and the memory material while the region R1 is further from the area of contact. (That is, region R2 is "proximate to" the area of contact while region R1 is "distant from" from the area of contact). Furthermore, it is also true that region R2 is closer to the memory material than region R1. (That is, region R2 is "proximate to" the memory material 250 while region R1 is "distant from" from the memory material).

Figure 4A:
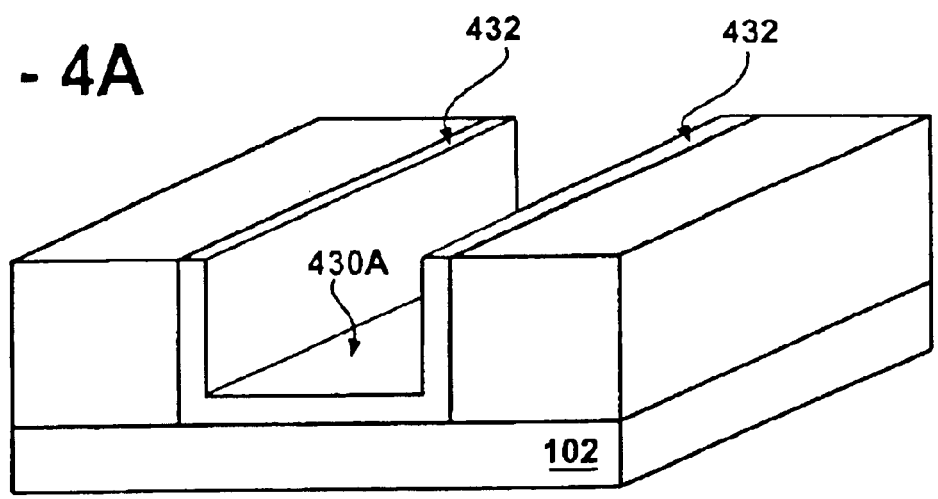
FIG. 4A is a conductive liner formed in a trench.
Figure 4B:
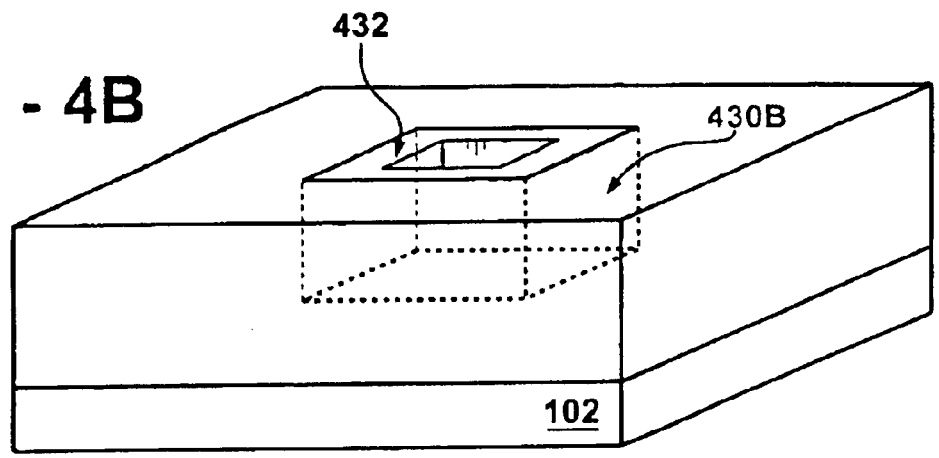
FIG. 4B is a conductive liner formed in a rectangular via.
Figure 4C:
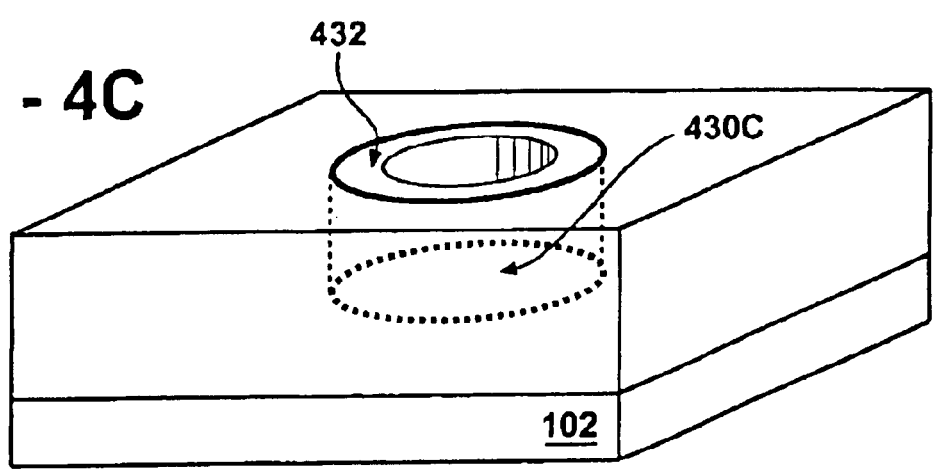
FIG. 4C is a conductive liner formed in a circular via.

In an alternate embodiment of the present invention, an electrical contact for a programmable resistance memory element may also be formed as a "conductive liner". The conductive liner is preferably a single layer of conductive material covering the sidewall surfaces as well as the bottom surface of a trench, via, or the like. Examples of conductive liners are shown in FIGS. 4A–C. In FIG. 4A, the conductive liner 430A is formed in a trench. FIG. 4B is an example of a conductive liner 430B formed in a rectangular via hole. FIG. 4C is an example of a conductive liner 430C formed in a circular via hole. Of course, other shapes are also possible. As shown in the FIGS. 4A–4C, each conductive liner has one or more sidewall layer portions as well as a bottom layer portion. The top end of the conductive liners is an open end having a top edge 432. (In the specific examples shown, the "top edge" 432 of each conductive liner is the surface formed by intersecting the respective conductive liner with a plane substantially parallel with the substrate 102). It is noted that the U-shaped conductive liner shown in FIG. 4A has a "dual" top edge 432.

It is noted that in the examples of the conductive liners shown in FIGS. 4A–4C, the sidewall layer portions are substantially vertically disposed. However, this does not have to be the case. The sidewall layer portions may be tilted. This would be the case if the conductive liners were formed in either a trench or via having angled sidewall surfaces.

The conductive liner is preferably edgewise adjacent to the memory material. That is, only an edge or a portion of an edge of the conductive liner is adjacent to the memory material. Substantially all of the remainder of the conductive liner is remote to the memory material. Preferably, substantially all electrical communication between the conductive liner and the memory material is through an edge or a portion of an edge of the conductive liner (that is, through an "edge portion" of the conductive liner.

Figure 5A:
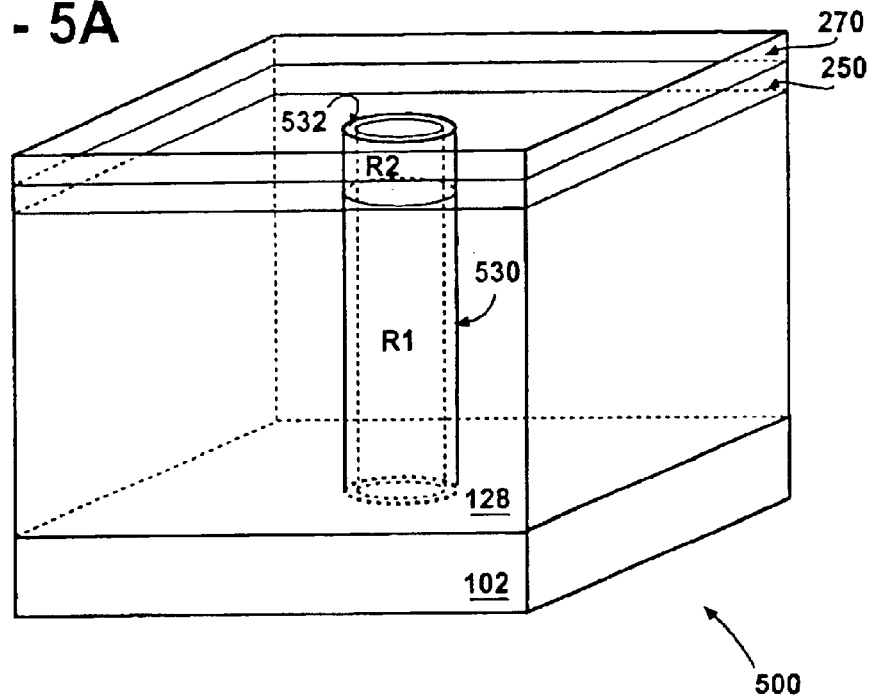
FIG. 5A is a three-dimensional view of a memory device having a multi-region conductive liner as an electrical contact.
Figure 5B:
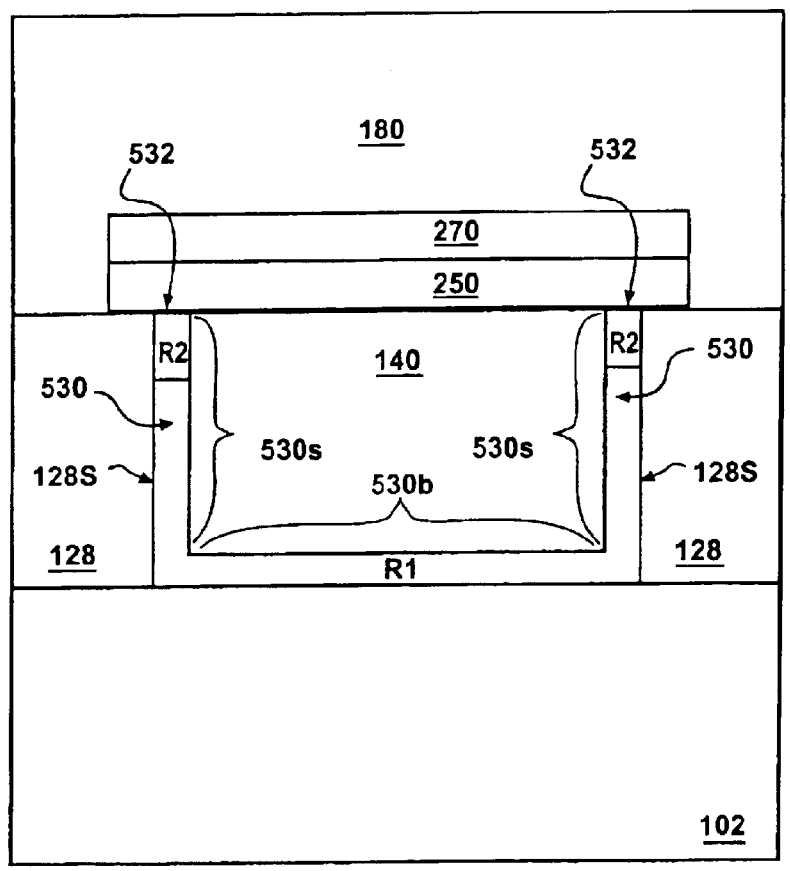
FIG. 5B is a cross-sectional view of the memory device of FIG. 5A.

FIGS. 5A and 5B depict an embodiment of the memory element of the present invention where one of the electrical contacts is a conductive liner 530 formed in a circular via hole. FIG. 5A is a three-dimensional view of the memory element. FIG. 5B is a cross-sectional view formed by intersecting a vertical plane through the memory element.

As seen, the conductive liner 530 is a cylindrical shell having an open top end (remote to and facing away from the substrate 102) and a closed bottom end (proximate to the substrate). The open top end has an annular-shaped top edge 532. The conductive liner 530 is a cylindrically shaped sidewall layer portion 530S and a bottom layer portion 530B.

In the example shown in FIGS. 5A and 5B, the conductive liner 530 is in the shape of a cylindrically shaped cup. As shown in FIG. 5B, the sidewall layer portion 530S forms the side of the cup while the bottom layer portion 530B forms the bottom of the cup. The top edge 532 may be referred to as the "rim" of the cup. The conductive liner may have other cup shapes such as a paraboloid, hemisphere, cone, and frustum.

The layer 250 of memory material is preferably a planar, substantially horizontally disposed layer positioned adjacent to the open end of the conductive liner 530. Hence, the memory material is adjacent only to the top edge 532 (i.e., the rim) of the conductive liner 530 or a portion of the top edge 532 of the conductive liner. The remainder of the conductive liner 530 is remote to the memory material. Preferably, substantially all electrical communication between the conductive liner 530 and the memory material occurs through the edge 532 or a portion of the edge 532. Hence, the area of contact is defined by all or a portion of the edge 532 (i.e., an edge portion).

The edge 532 is an annulus having a thickness equal to the thickness of the conductive liner 530. The thickness of this annulus, and hence the area of contact between the conductive liner and the memory material may be reduced by decreasing the thickness of the conductive liner 530 deposited into the circular via.

In one embodiment, the conductive liners are "multi-regioned" and comprise at least a first region R1 having a first resistivity and a second region R2 having a second resistivity which is greater than the resistivity of the first region R1. In general, the first region R1 and second region R2 may be positioned anywhere in the conductive liners. Examples of possible ways of positioning the first and second regions were discussed above with regards to conductive sidewall spacers. That entire discussion is applicable to conductive liners. For example, in one configuration, the more resistive second region R2 may be positioned adjacent to the memory material while the less resistive first region R1 may be positioned remote to the memory material. In another configuration, the second region R2 is may be positioned adjacent to the area of contact while the region R1 may be remote to the area of contact. In yet another configuration, the second region R2 may be positioned adjacent to an edge of the conductive liner while the region R1 may be positioned remote to this edge.

In the embodiment shown in FIGS. 5A and 5B, the more resistive region R2 is a "top portion" of the conductive liner adjacent to the top edge 532 and extending for some distance downwardly (toward the substrate) into the interior of the conductive liner. (That is, the more resistive top portion of the conductive liner includes all or a portion of the top edge 532).

It is noted that it is also possible that one or more intermediate layers be disposed between the memory material and the conductive liner. Also, it is possible that the conductive liner include at least a third region of material in addition to the first and second regions discussed above. The third region may be disposed between the memory material and the more resistive second region.

Figure 6A:
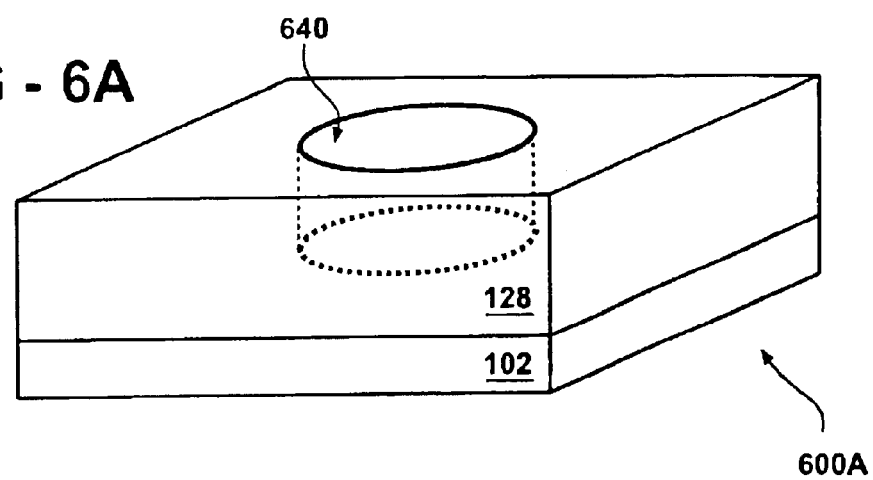
FIGS. 6A–6G is a process for making a memory device of the present invention having a multi-region conductive liner as an electrical contact.
Figure 6B:
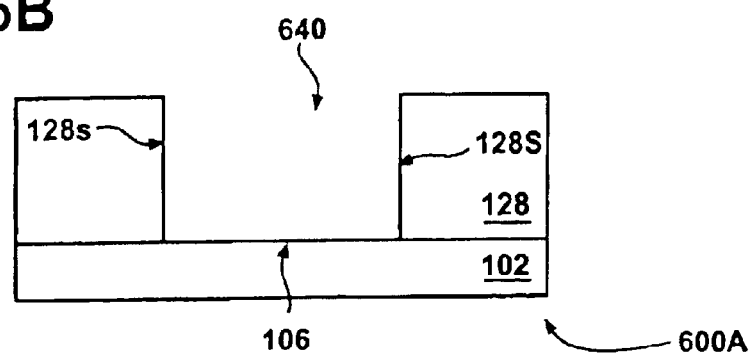

An embodiment of a method for fabricating the memory element 500 from FIGS. 5A and 5B is shown in FIGS. 6A–6F. Referring first to FIG. 6A, a substrate 102 is provided and a dielectric layer 128 is deposited on top of the substrate 102. The dielectric layer may be formed from silicon dioxide and may be deposited by a chemical vapor deposition process. The dielectric layer 128 is then appropriately masked and etched to form a via hole 640 in the dielectric 128 as shown. The via hole may be round, square, rectangular or irregularly shaped. (Alternately, the dielectric layer 128 may be masked and etched to form a trench). In the embodiment shown in FIG. 6A, the resulting structure 600A is a circular via 640 which is formed in the dielectric 128. FIG. 6B is a vertical cross-sectional view of the structure 600A shown in FIG. 6A. The sidewall surface 128S and the bottom surface 106 of the circular via 640 is shown in FIG. 6B.

Figure 6C:
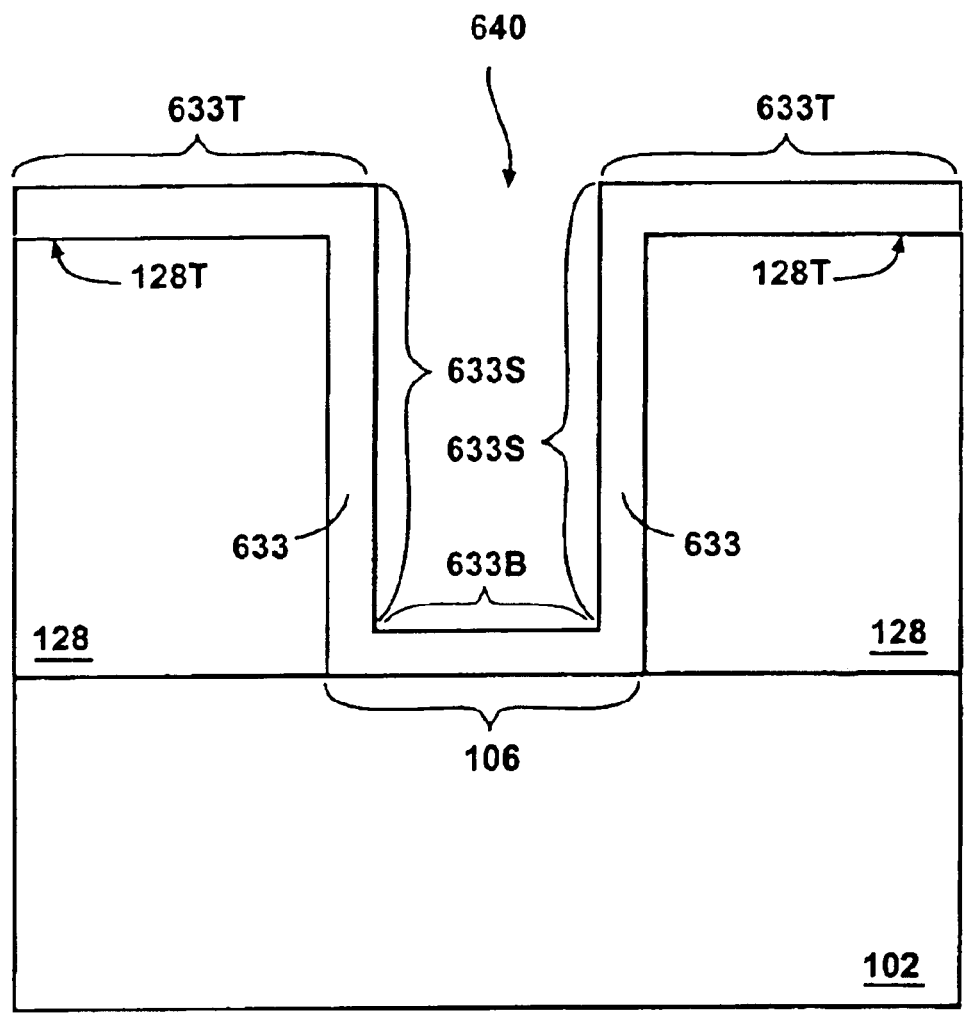

A layer 633 of a conductive material is deposited on top of the structure shown in FIGS. 6A and 6B to form the structure 600C shown in FIG. 6C. The layer 633 of conductive material is conformally deposited on top surfaces 128T of the dielectric region 128, on the sidewall surface 128S of the region 128 and the bottom surface 106 of the via hole 640. Hence, the layer 633 has a top portion 633T, a sidewall layer portion 633S, and a bottom layer portion 633B. It is noted that the layer 633 will form the first region R1 of the "dual-regioned" conductive liner electrical contact shown in FIGS. 5A and 5B. Hence, the materials chosen for the layer 633 should have the appropriate resistivity. The possible materials which may be used for the remote region R1 have been described above. As noted above, examples of appropriate materials which may be used for the first region R1 include n-type doped polysilicon, p-type doped polysilicon, n-type doped silicon carbide, p-type doped silicon carbide, titanium tungsten, tungsten silicide, tungsten, molybdenum, and titanium nitride. As discussed, a first region R1 of n-type polysilicon may be formed by depositing and doping intrinsic polysilicon. That is, by doping intrinsic polysilicon in situ (i.e., CVD deposition in a phosphene environment). Alternately, n-type polysilicon may be formed by first depositing intrinsic polysilicon and then doping the polysilicon via ion implantation of phosphorous or arsenic. P-type polysilicon may be formed by first depositing intrinsic polysilicon and then doping the polysilicon via ion implantation of boron. Ion implantation may be performed by an "angle implant" whereby the ion beam comes in at an angle to an axis which is perpendicular to the substrate.

Figure 6D:
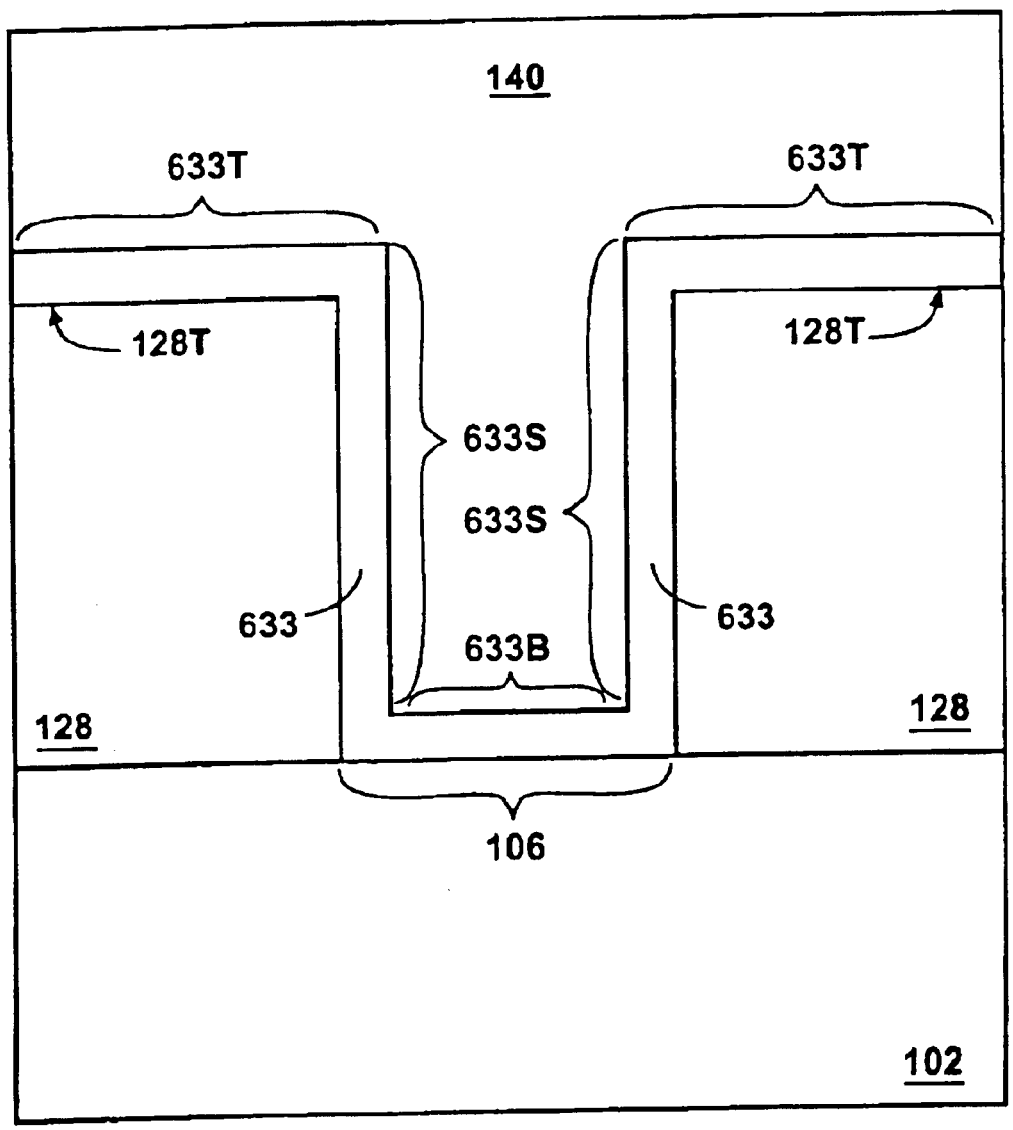

A layer of dielectric material 140 (such as silicon dioxide) may then be deposited on top of the layer 633 so as to fill the via 670 and form the structure 600D shown in FIG. 6D. The structure 600D may then be chemically mechanically polished (CMP) or dry etched so as to planarize the top surface thereby removing the top surface 633T portion of the layer 633 and forming a cylindrical, cup-shaped conductive liner. This is shown as structure 600E in FIG. 6E where the conductive liner 630 has a sidewall layer portion 630S along the sidewall 128S and a bottom layer portion 630B along the bottom surface 106. Furthermore, the conductive liner 630 has a top edge 632. Preferably, the planarization step forms a substantially planar top edge 632.

Figure 6E:
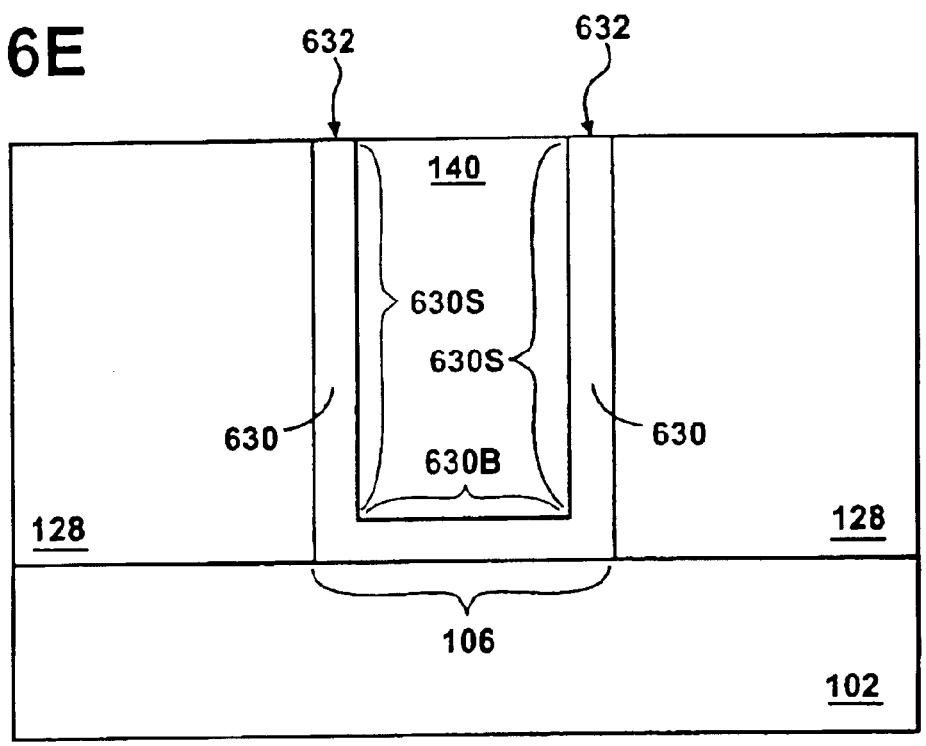
Figure 6F:
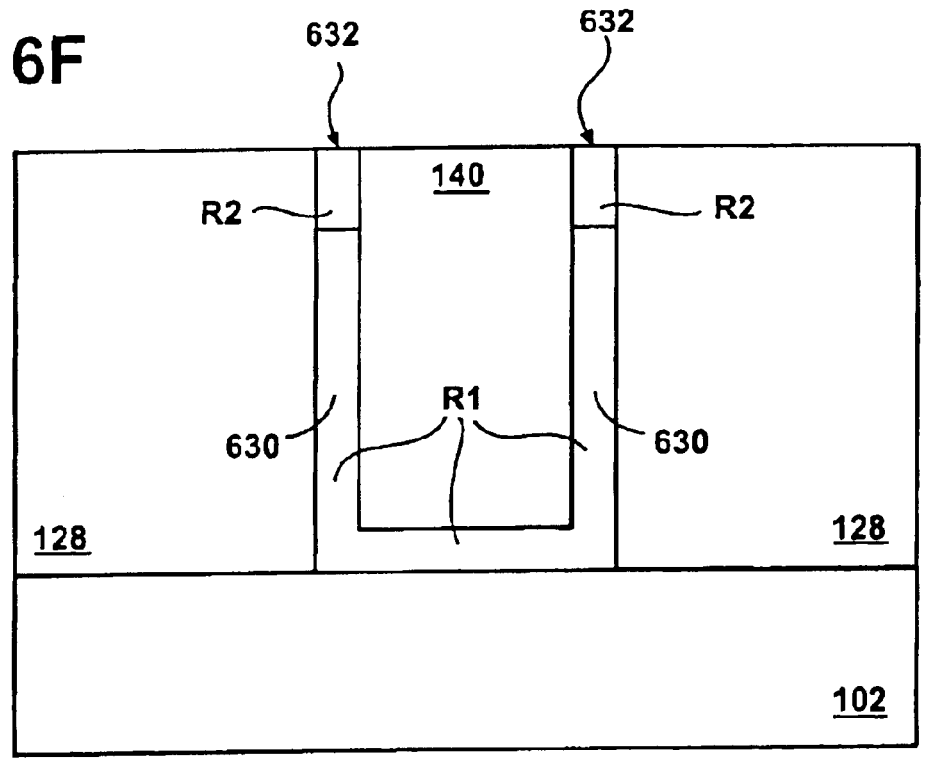
Figure 6G:
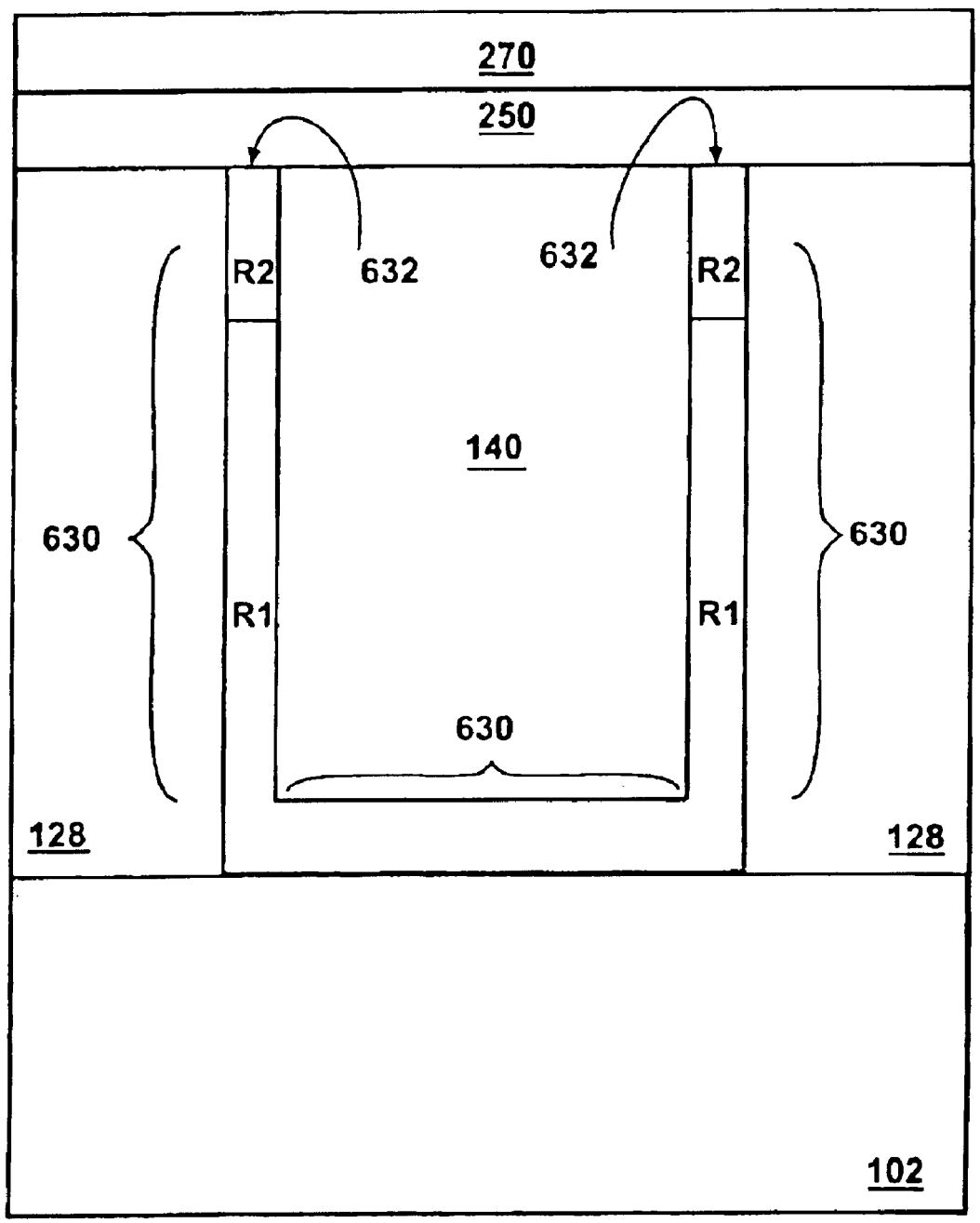

After this step in the process, the conductive liner 630 comprises only a single region of material which is denoted in FIG. 6E as the first region of material R1. The next step is to increase the resistivity of a portion of the conductive liner 630 that includes the top edge 632 or a portion of the top edge 632. As shown in FIG. 6F, a second region R2, more resistive than the first region R1, is formed in a top portion of the conductive liner adjoining the edge 632. The second region R2 of the conductive liner may be formed by any of the methods which have been described above with regards to forming the multi-region conductive sidewall spacers. For example, the second region R2 may be formed by counter doping the n-type polysilicon of the first region R1. Specifically, the n-type polysilicon may be counter doped with boron to form a second region R2 comprising either n- or p-polysilicon. The second region may also be implanted with modifier elements in combination with the counter-doping ions or individually. Alternately, a top portion of the first region R1 may be removed (preferably, by being selectively etched) to form a recess. This recess may then be filled with a material which has a resistivity which is greater than the resistivity of the R1 material. For example, the recess may be filled with a material such as n- or p-polysilicon. Alternately, the recess may be filled with undoped polysilicon which can then be appropriately doped (preferably with boron, arsenic or phosphorus) to make it more resistive.

After the second region R2 is formed, the layer 250 of memory material and the layer 270 of conductive material (forming the second electrical contact) may then be deposited. The area of contact between the conductive liner 630 and the memory material 250 is the surface portion of the conductive liner through which substantially all electrical communication (between the conductive liner and the memory material) occurs. This may be the entire edge 632 or a portion of the edge 632. (If the entire edge makes contact with the memory material then the area of contact is in the form of an annular ring). Hence, the memory material 250 is in electrical communication with the conductive liner 630 only through all or a portion of the edge 632.

Figure 5C:
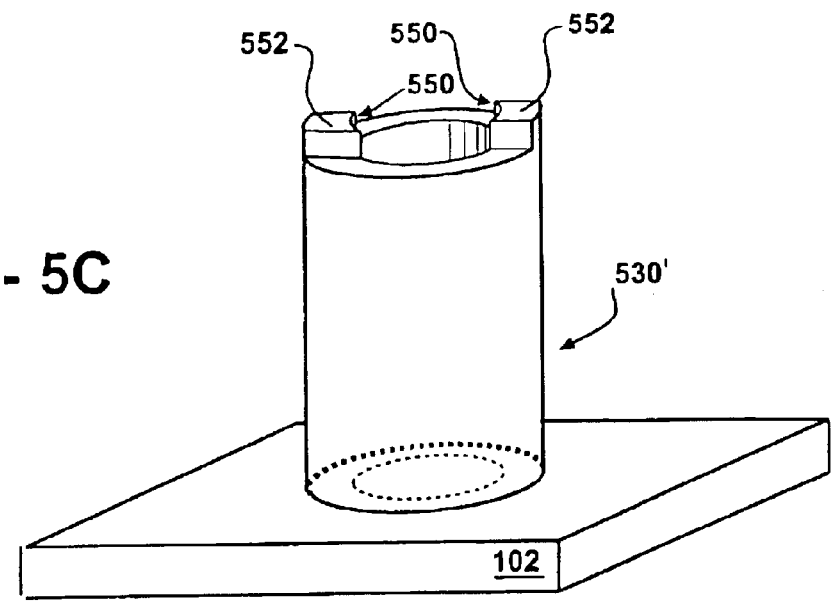
FIG. 5C is a three-demensional view of a cylindrically shaped conductive liner with columnar protrusions.

Referring to FIG. 5C, FIG. 5C shows an alternate embodiment of a cylindrical conductive liner. In this embodiment, the conductive liner includes at least one columnar portion 550 which protrudes toward the memory material (the memory material is not shown in this diagram). In the embodiment shown, the columnar portions 550 each have a thickness which is substantially the same as the thickness of the remainder of the conductive liner 530'. FIG. 5C shows the cylindrical conductive liner 530' disposed on top of a substrate 102. The columnar protrusions may be formed on all types of conductive liners (for example, they may be formed on the conductive liners shown in FIGS. 4A–4C). Furthermore, they may be formed with the use of oxide spacers. Preferably, substantially all of the electrical communication between the memory material and the conductive liner 530' is through a tip 552 of at least one of the columnar protrusions 550. Hence, the contact 530' and the memory material may be positioned so that only the tip(s) 52 of one or more of the columnar protrusions 550 is/are adjacent to the memory material while substantially all of the remaining portion of the contact is remote to the memory material. The columnar protrusions 550 may also include at least a first region R1 with a first resistivity and a second region R2 with a second resistivity greater than the first resistivity. The more resistive region is preferably adjacent to the memory material while the less resistive region is preferably remote to the memory material.

Hence, disclosed herein is an electrically operated memory element comprising a volume of memory material and one or more electrical contacts in electrical communication with the memory material. In one embodiment, substantially, all electrical communication between the memory material and at least one of the contacts is through an edge of a contact or a portion of an edge of a contact. In this embodiment, the "area of contact" between the contact and the memory material is an edge or a portion of an edge of the contact (i.e., an edge portion).

The contact is preferably "edgewise adjacent" to the memory material so that only an edge or a portion of an edge of the contact is adjacent to the memory material while substantially all of the remainder of the contact is remote to the memory material. Examples of edgewise adjacent configurations have been described above.

The contact may be in the form of a single layer referred to as a "contact layer". The contact layer may have any shape or conformation. It may be a substantially planar surface. Alternately, it may be a curved surface. For example, the layer may be in the shape of a saddle, a cup, a cylinder, a tube, a hemisphere, a cone, a box, etc. Also, the contact layer may have any orientation. For example, it may be substantially vertically disposed, substantially horizontally disposed or tilted at some angle.

The contact layer may be a sidewall layer deposited along a sidewall surface. Any sidewall surface may be used. Examples include the sidewall surface of a trench, via, mesa or pillar. The sidewall surface may also be angled from the substrate and/or angled from the memory material. The contact layer may be a substantially vertically disposed layer which is formed in other ways besides with the use of conformal deposition. The contact layer may be in the form of a conductive spacer or a conductive liner. The contact layer may be cupped shaped.

The contact layer need not actually contact the memory material. Also, it is possible that there me one or more intermediate layers between the memory material and the contact layer.

In one embodiment, the contact layer is substantially perpendicular to the volume of memory material. That is, the angle of incidence "THETA" between the memory material and the contact layer is preferably about 90°. Other embodiments are also possible where the contact layer and the memory material are not substantially perpendicular. In one embodiment, the angle of incidence "THETA" between the contact layer and the memory material may be any angle greater than about 15° and less than about 165°. In another embodiment, the angle of incidence "THETA" is preferably between about 30° and 150°, more preferably between about 45° and 135°, and most preferably between about 60° and about 120°.

While not wishing to be bound by theory, it is believed that positioning the contact layer so that it is substantially perpendicular to the memory material may increase the effective amount of heat energy transferred to and remaining within the memory material. The area of contact (defined by the edge of the contact layer) is smaller when the contact layer is perpendicular to the memory material.

Also, it is believed that the less resistive material R1 (remote to the memory material) may behave as a heat sink, absorbing some of the heat generated by the more resistive portion R2 (adjacent the memory material). Positioning the contact layer substantially perpendicular to the memory material increases the average distance between the memory material and the less resistive material R1 of the contact layer. Hence, less of the Joule heat generated in or near the memory material is absorbed back by the contact layer.

Contact layers which are substantially vertically disposed have been described above with reference to the conductive spacer and liners. As mentioned above, other embodiments of the substantially vertically disposed layers are possible which are not formed as conductive spacers or liners. That is, vertical layers may be formed without the conformal deposition of a layer onto a sidewall surface. For example, vertical layers may be formed with the use of oxide spacers.

Figure 7A:
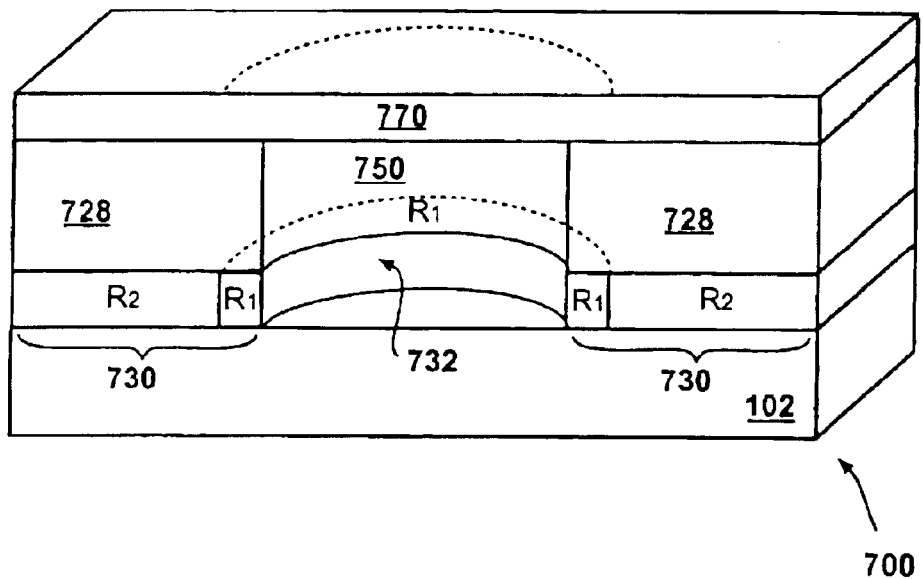
FIG. 7A is a three-dimensional view of a memory element of the present invention having a horizontally disposed contact layer edgewise adjacent to a volume of memory material.
Figure 7B:
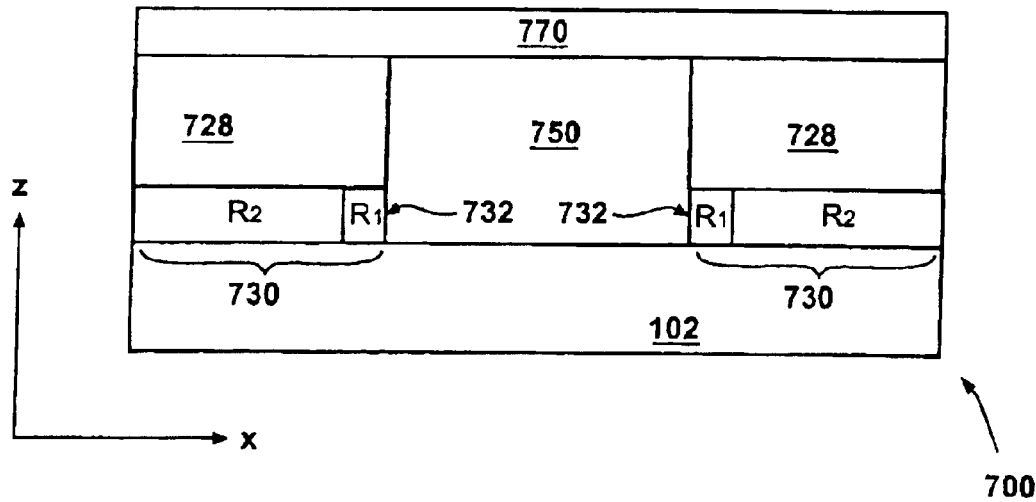
FIG. 7B is a cross-sectional view of the memory element from FIG. 7A.

The contact layer may also be substantially horizontally disposed. FIG. 7A shows a three-dimensional view of an embodiment of a memory element 700 of the present invention formed on a substrate 102. The memory element 700 comprises the volume of memory material 750, a first electrical contact in the form of contact layer 730, and a second electrical contact 770 spacedly disposed from the contact layer 730. The contact layer 730 is a substantially horizontally disposed layer having an edge 732 adjacent to the memory material 750. FIG. 7B is a vertical cross-sectional slice of the same memory device 700. The contact layer 730 has a first region R1 remote to the volume of memory material 750 and a second region R2 which is adjacent to the memory material 750. The adjacent second region R2 has a higher resistivity than the remote first region R1.

In the embodiment shown in FIGS. 7A,B the first contact 730 is a contact layer 730 which is substantially horizontally disposed onto the substrate 102. The contact layer 730 is edgewise adjacent to the memory material 750. That is, the contact layer 730 has an edge 732 which is adjacent to the volume of memory material 750. The remainder of the contact layer 730 is remote to the memory material. Hence, all electrical communication between the contact layer 730 and the memory material 750 is through the edge 732. Hence, the area of contact between the memory material 750 and the contact layer 730 is the edge 732 of the contact layer 730. (As shown, in this embodiment the edge is a surface substantially parallel to the thickness of the contact layer). The area of contact between the contact layer 730 and the memory material 750 is proportional to the thickness of the contact layer 730.

Preferably, the edge 732 encircles a cross-sectional slice of the volume of memory material 750. As used herein, "encircles" means that the edge 732 passes completely around a cross-sectional slice of the volume of memory material 750. However, the memory element may be structured so that the edge only partially encircles a cross-sectional slice of the volume of memory material 750. In the embodiment shown, the cross-sectional slice is substantially parallel to the plane of the substrate 102, however, other orientations are also possible.

The second contact 770 may be a layer of conductive material and is preferably formed as a thin-film layer. In the embodiment shown in FIGS. 7A,B, the second contact 770 is a conductive layer deposited on top of the memory material 750 so that the bottom surface of the conductive layer 770 is adjacent to the top surface of memory material 750.

It is noted that one or more intermediate layers may be disposed between the memory material and the contact layer. Also, the contact layer may have one or more additional regions in addition to the first and second regions described above. It is possible that the additional regions be placed anywhere in the contact layer.

Another embodiment of the present invention is an electrically operated memory element having a volume of memory material and one or more contacts in electrical communication with the memory material. In this embodiment at least one of the contact includes at least a first region R1 having a first resistivity and a second region R2 having a second resistivity greater than the first resistivity.

Figure 8:
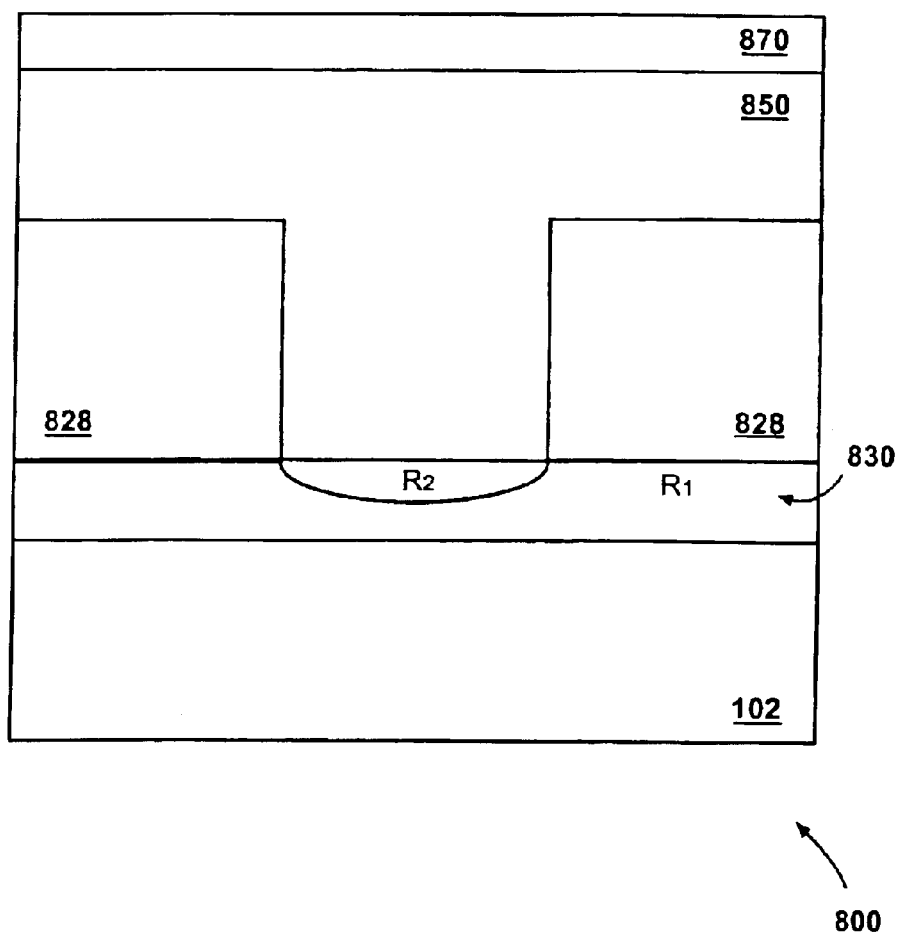
FIG. 8 is a cross-sectional view of a memory element of the present invention showing a contact having a first region having a first resistivity and a second region having a second resistivity.

In this embodiment, the contact may have any shape and need not be positioned edgewise adjacent to the memory material (although, as shown in FIG. 1A, it may be). An example of an embodiment where the contact is not edgewise adjacent to the memory material is shown in FIG. 8. FIG. 8 shows a memory element 800 having a first contact 830 in electrical communication with memory material 850. Dielectric material 828 forms a trench or via structure. The first contact 830 includes a first region R1 having a first resistivity and a second region R2 having a second resistivity greater than the first resistivity. In the embodiment shown the first contact 830 is a single layer (that is, it is a single "contact layer"). The higher resistivity second region is adjacent to the memory material while the lower resistivity first region is remote to the memory material. It is noted that in the embodiment shown in FIG. 8, the electrical communication between the first contact 830 is through a portion of a face of the contact layer rather than through an edge of the contact layer. The first and second regions R1 and R2 may be formed from the appropriate contact materials. Examples of appropriate materials have been described above. In one embodiment, the region R1 and the region R2 may be differently doped.

The memory element 800 also includes a second contact 870. In an alternate embodiment, the second contact 870 may also be multi-regioned. That is, it may also include at least a first region having a first resistivity and a second region having a second resistivity greater than the first resistivity.

Generally, the first and second regions may be positioned anywhere. Several preferable configurations have been described above with reference to the conductive spacer and/or conductive liner. For example, as shown in FIG. 8, the more resistive second region may be adjacent (either directly or proximately) to the memory material and the less resistive first region may be remote to the memory material. Positioning the more resistive second region adjacent to the memory material and the less resistive first region remote to the memory material provides for more efficient heat transfer from the contact material to the memory material. The materials used for the first region R1 and second region R2 are described above with reference to the conductive spacers and conductive liners.

The memory elements of the present invention may be electrically coupled to isolation/selection devices and to addressing lines in order to form a memory array. The isolation/addressing devices permit each discrete memory cell to be read and written to without interfering with information stored in adjacent or remote memory cells of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies.

Hence, associated with each memory element of a memory array structure is isolation/addressing device which serves as an isolation/addressing device for that memory element thereby enabling that cell to be read and written without interfering with information stored in other adjacent or remote memory elements of the array.

The memory element of the present invention comprises a volume of memory material. Preferably, the volume of memory material is programmable to at least a first resistance state and a second resistance state. The memory material is preferably programmed in response to electrical signals. Preferably, the electrical signals used to program the materials are electrical currents which are directed to the memory material.

In one embodiment, the memory material is programmable to two resistance states so that each of the memory elements is capable of storing a single bit of information. In another embodiment, the memory material is programmable to at least three resistance states so that each of the memory elements is capable of storing more than one bit of information. In yet another embodiment, the memory material is programmable to at least four resistance states so that each of the memory elements is capable of storing at least two bits of information. Hence, the memory materials may have a range of resistance values providing for the gray scale storage of multiple bits of information.

The memory materials may be directly overwritable so that they can be programmed from any of their resistance states to any other of their resistance states without first having to be set to a starting state. Preferably, the same programming pulse or pulses may be used to program the memory material to a specific resistance state regardless of its previous resistance state. (For example, the same current pulse or pulses may be used to program the material to its high resistance state regardless of its previous state). An example of a method of programming the memory element is provided in U.S. Pat. No. 6,075,719, the disclosure of which is incorporated by reference herein.

The memory material may be a phase change material. The phase-change materials may be any phase change memory material known in the art. Preferably, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. In one embodiment, the memory material comprises the elements Te, Ge and Sb. In another embodiment, the memory material consists essentially of Te, Ge and Sb. An example of a memory material which may be used is $Te_2Ge_2Sb_5$.

The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified memory material is a phase-change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. Preferably, the transition metal may include Cr, Fe, Ni, Nb, Pd, Pt and mixtures or alloys thereof.

A second example of an elementally modified memory material is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. Preferably, the transition metal may include Cr, Fe, Ni, Pd, Pt, Nb, and mixtures or alloys thereof.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A method of making an electrically programmable memory element, comprising the steps of:
   providing a first conductive material;
   removing a portion of said first conductive material;
   replacing at least a portion of said removed first conductive material with a second conductive material, said second conductive material having a resistivity which is greater than the resistivity of said first conductive material; and
   introducing a programmable resistance material proximate to said second conductive material and distant from said first conductive material.

2. The method of claim 1, wherein said programmable resistance material is a phase change material.

3. The method of claim 1, wherein said programmable resistance material includes a chalcogen element.

4. The method of claim 1, wherein said first conductive material is doped differently from said second conductive material.

* * * * *